(12) United States Patent
Gurvich et al.

(10) Patent No.: US 7,049,907 B2
(45) Date of Patent: May 23, 2006

(54) SYSTEM AND METHOD FOR ADJUSTING GROUP DELAY

(75) Inventors: Mark Gurvich, Costa Mesa, CA (US); Alex Rabinovich, Cypress, CA (US); Nikolai Maslennikov, Huntington Beach, CA (US); Jianqing He, Cerritos, CA (US)

(73) Assignee: Powerwave Technologies, Inc., Santa Ana, CA (US)

( * ) Notice: Subject to any disclaimer, the term of this patent is extended or adjusted under 35 U.S.C. 154(b) by 90 days.

(21) Appl. No.: 10/805,634

(22) Filed: Mar. 19, 2004

(65) Prior Publication Data

US 2004/0239446 A1 Dec. 2, 2004

Related U.S. Application Data

(63) Continuation-in-part of application No. 10/151,835, filed on May 20, 2002, now Pat. No. 6,856,215.

(60) Provisional application No. 60/314,840, filed on Aug. 24, 2001.

(51) Int. Cl.
*H01P 9/00* (2006.01)

(52) U.S. Cl. ............... 333/156; 333/139; 333/144; 333/161; 333/214

(58) Field of Classification Search ............... 333/156, 333/139, 144, 161, 214
See application file for complete search history.

(56) References Cited

U.S. PATENT DOCUMENTS

| | | | |
|---|---|---|---|
| 3,631,270 A | 12/1971 | Heinemann | 307/295 |
| 3,646,464 A | 2/1972 | Boggs | 330/30 D |
| 3,699,480 A | 10/1972 | Mueller | 333/28 |
| 3,800,265 A | 3/1974 | Yoshioka et al. | 333/28 |
| 3,849,744 A | 11/1974 | Puruya | 333/28 |
| 3,906,409 A | 9/1975 | Whitehouse | 333/29 |
| 4,140,983 A | 2/1979 | Tamori et al. | 333/18 |
| 4,189,690 A | 2/1980 | Bock et al. | 332/30 |
| 4,197,514 A | 4/1980 | Kasuga et al. | 333/28 |
| 4,367,445 A | 1/1983 | Dydyk | 333/127 |
| 4,490,693 A | 12/1984 | Behrend | 333/28 |
| 4,524,337 A | 6/1985 | Brinegar | 333/28 |
| 4,609,887 A | 9/1986 | Taralp | 333/28 |
| 4,630,285 A | 12/1986 | Dyer et al. | 375/37 |
| 4,988,962 A | 1/1991 | Janer | 333/28 |
| 5,146,192 A | 9/1992 | Kondo et al. | 333/164 |
| 5,311,155 A | 5/1994 | Blodgett | 333/28 |
| 5,999,077 A | 12/1999 | Hammond et al. | 336/134 |
| 6,100,757 A | 8/2000 | Kotzamanis | 330/151 |
| 6,127,873 A | 10/2000 | Portaluri et al. | 327/278 |
| 6,226,322 B1 | 5/2001 | Mukherjee | |
| 6,266,457 B1 | 7/2001 | Jacob | 385/11 |
| 6,356,149 B1 * | 3/2002 | Stengel et al. | 330/107 |
| 6,400,237 B1 | 6/2002 | Seino | 333/156 |

FOREIGN PATENT DOCUMENTS

DE 2747871 5/1979
FR 2365243 4/1978

* cited by examiner

*Primary Examiner*—Robert Pascal
*Assistant Examiner*—Kimberly Glenn
(74) *Attorney, Agent, or Firm*—Myers Dawes Andras & Sherman, LLP.

(57) ABSTRACT

A group delay adjusting circuit. The group delay adjusting circuit comprises an electronically adjustable variable capacitance, and an electronically variable virtual inductor coupled in parallel to the electronically variable capacitance at a node.

23 Claims, 15 Drawing Sheets

SYSTEM AND METHOD FOR ADJUSTING GROUP DELAY

CROSS-REFERENCE TO RELATED APPLICATION

This application is a continuation-in-part of U.S. patent application Ser. No. 10/151,835, entitled "System and Method for Adjusting Group Delay", filed May 20, 2002, now U.S. Pat. No. 6,856,215, which is based on U.S. Provisional Application "A Group Delay Adjusting Circuit" Application No. 60/314,840 filed Aug. 24, 2001, the contents of which are hereby incorporated by reference.

BACKGROUND OF THE INVENTION

Group delay adjuster circuits play a key role in a number of applications which require compensation for group delay, such as feedforward power amplifiers, and the like. In an exemplary feed forward amplifier, a group delay adjusting circuit might be used in loop compensation circuitry such as a phase and gain adjuster. Alternatively, the group delay adjusting circuit may be implemented as a separate functional block prior to the phase and gain adjusting circuit.

In an electrical network transmission without distortion is typically achieved when an amplitude and a group delay response of a network are as close to constant as possible. If an electrical network has a non-constant group delay, group delay compensation in the form of an electric compensation, or group delay adjusting, circuit may be added so that the overall electrical network response is more nearly constant.

As will be appreciated by those skilled in the art the frequency response of a network may be represented as a function of a frequency T, by $F(jT)=A(jT)+B(jT)$ or equivalently as $F(jT)=*F(jT)*e^{jN(T)}$. The magnitude of the amplitude response of the network is defined as $*F(jT)*=[A^2(jT)+B^2(jT)]^{1/2}$. The phase angle of the network is defined as $N(T)=\tan^{-1}[A(jT)/B(jT)]$. The group delay of the network is defined as $\theta(T)=dN(T)/dT$. Two signals having an equal propagation delay have equal phase verses frequency slopes. Two signals have constant delay when the phase verses frequency slope, or group delay is constant. The group delay response of a the network is the response that is sought to be compensated for with a group delay adjusting circuit so that an overall group delay response for the composite response of the two networks tends to be flattened, and thus compensated for. Feed forward power amplifiers amplify multiple carriers, or groups of frequencies.

In a patent issued to Kondo et al. (U.S. Pat. No. 5,146,192) a delay circuit comprising a variable capacitance diode and an inductor is disclosed. In this circuit, an input signal is applied to a series inductance that is made up of discrete series inductors. The inductors of this circuit are not variable, but fixed in value. A series of shunt capacitance comprising diodes are coupled at the node where each of the series inductors are joined. The parallel capacitance is formed from two diodes that are connected cathode to anode at the junction of each pair of inductors to cause each diode to form an equal capacitance, equal and opposite signal voltage are applied to each diode. The capacitance of each variable capacitance diode (varactor) is adjusted by applying a control voltage of the same magnitude to each of the diodes. The control voltage applied to each varactor diode is equal in amplitude and opposite in polarity. Thus, a single control voltage is applied to the circuit, but the circuit must provide a way of reversing the polarity. Those skilled in the art will realize that, this may be accomplished by providing a circuit such as an inverting amplifier to respective varactor diodes.

A patent issued to Bock et al. (U.S. Pat. No. 4,189,690) discloses a resonant linear frequency modulator. As shown in FIG. 1 of this patent, an oscillator is coupled to a modulator circuit through a matching circuit. Where the matching circuit provides the required mismatch between the modulator and oscillator needed to maintain oscillator modulation. The modulator is biased by two DC signals VB and −VB that do not vary or change. These DC signals are applied through radio frequency (RF) chokes implemented in quarter wavelength microstrip line to prevent RF signals from leaking into the power supplier coupled to the bias port. The bias ports also include shunt bypass capacitors selected such that any energy from radio frequency signals passing through the RF choke is shunted to the ground by the low impedance of the capacitor at RF frequencies. This prevents contamination of the power supply or bias supplies.

The modulator includes three reactants elements, a varactor diode (34 of FIG. 1), a varactor (36 of FIG. 1) and an inductor (42 of FIG. 1). Varactor 36 and inductor 42 are made to appear as an inductance to the oscillator circuit through a quarter wavelength transmission line section 38 disposed between varactor 34 and varactor 36. The impedance seen by the oscillator is zero with no modulating signal applied at the modulating signal input port Vm. Both the inductive and capacitive reactances are changed in an equal amount by the single modulating signal that is applied to the modulator.

The modulating signal is used to change the frequency produced by the oscillator in proportion to the modulating signal, such as typically occur in FM modulation. The circuit is not used to adjust group, or envelope delay of a band signals as would be done with a group delay adjusting circuit. As shown, the output 13 is an FM signal.

The bias voltages are applied or substantially identical and opposite in polarity, and serve to back (reverse) bias the varactors. When the single modulating voltage input is applied to this circuit, a reactive imbalance is formed at opposite ends of the quarter wavelength impedance transforming line (38 of FIG. 1). The modulating voltage operates in a push/pull manner to apply a capacitive or inductive reactance to the oscillator. The oscillator and matching circuits have been designed for low Q (quality factor) and are thus sensitive to changes in reactance applied by the modulating circuit. The oscillator frequency is caused to change due to the change in reactance of the modulating circuit. Thus, the single modulating voltage causes the frequency modulation of the oscillator to produce a frequency modulated signal.

A patent issued to Seino (U.S. Pat. No. 6,400,237) discloses a phase compensation circuit. In order to provide phase compensation, the circuit disclosed in this patent utilizes a parallel combination of an inductance and a capacitance, where the capacitance is provided by a varactor diode. In an embodiment having a variable inductor, the inductor is varied by changing the length of its circuit path, which is a time-consuming operation that must be performed by hand (see FIGS. 5A and 5B of the Seino patent). This type of inductance is not electronically tunable and inherently not suitable for use in a dynamically adjustable group delay adjusting circuit.

Another embodiment shown in Seino utilizes a quarter wavelength transmission line coupled to a main transmission line having a variable capacitance disposed on the opposite end of it. (See FIG. 10 of Seino) However, this arrangement utilizes only a single control voltage to adjust the impedance. The impedance adjusted typically varies between the capacitive and an inductive value depending upon the tuning voltage. Missing from this arrangement is a parallel capacitance that may be independently tuned.

Often it is desirable to match the characteristics of signal paths to optimize electrical performance. For a feedforward amplifier to be effective over a wide bandwidth in canceling distortion it is desirable to have cancellation loops with the greatest cancellation possible over the greatest bandwidth possible. For example, in a linear feed forward power amplifier (FFPA), one or more error correcting, or error cancellation, loops are present. In each loop a signal will typically travel through an active signal path present in active circuits and a passive signal path through the passive circuits. Loop cancellation tends to be optimal when signals traveling over the active and passive signal paths tend to have equal amplitude responses, opposite phase responses, and equal group delay.

Compensation is typically provided by a network having inductors and capacitors disposed in it to achieve a compensating response. Inductors are usually difficult to build, and often require trimming and/or adjustment. In particular mechanical variable inductors are difficult to build, and particularly unsuited to high frequency applications. For example see U.S. Pat. No. 6,400,273 describing a mechanically adjustable variable inductor, where the inductance is varied by varying the position and length of a thin metal line. Other types of inductors are typically implemented for example, by a coil of wire wound on a form, or a spiral of foil disposed upon a substrate or printed circuit board, and typically provided with some sort of mechanical adjustment to vary the inductance.

For example a variable inductor is described in U.S. Pat. No. 5,999,077 issued to Hammond, et al. that describes a voltage controlled variable inductors using a variable air gap to control inductance. Those skilled in the art will appreciate that air/transformer gap variable inductors are extremely bulky, expensive and limited in frequency response due to the physical construction and material used. It is desirable to imitate such an electrically variable inductor or the like by providing a component that produces a negative reactance, without utilizing any of the conventional inductor components. Such a novel component could be said to produce a negative reactance, or inductance virtually. That is a "virtual inductor" that is able to produce a variable inductance (or negative reactance), without the use of a conventional variable inductor component is desirable.

SUMMARY OF THE INVENTION

The present invention therefore provides a method of adjusting a group delay adjusting circuit comprising, applying a capacitive control signal to adjust a first variable capacitance; adjusting the first variable capacitance by applying the capacitive control signal to the first variable capacitance such that the capacitance of the group delay adjusting circuit is adjusted; applying an inductive control signal to a second variable capacitance, and adjusting the second variable capacitance by applying the inductive control signal to the second variable capacitance of a virtual inductor such that the inductance of the group delay adjusting circuit is adjusted.

In accordance with a further aspect of the present invention a method of adjusting a group delay adjusting circuit comprising, applying a capacitate control signal to adjust a first variable capacitance, adjusting the first variable capacitance by applying conjunctional positive capacitive control signal to the first variable capacitance, applying an inductive control signal to a second variable capacitance; and adjusting the second variable capacitance by applying a conjunctional positive inductive control signal to the second variable capacitance is provided.

In accordance with a further aspect of the present invention, a group delay adjusting circuit, comprising, a transmission line having an input and an output, and a stub matching structure including a virtual inductor having a first terminal coupled to the transmission line and a second terminal coupled to ground, and including a first delay adjust signal input, a second delay adjust signal input and a DC bias input, whereby a group delay of a signal envelope coupled to the input of the transmission line is adjusted at the output of the transmission line, by coupling a first variable voltage to the first delay adjust signal input, coupling a second variable voltage to the second delay adjust signal input, and coupling a DC bias voltage to the DC bias input is provided.

In accordance with still another aspect of the present invention, a group delay adjusting circuit comprising, an electronically adjustable variable capacitance having its capacitance adjusted by a first delay adjust signal, and an electronically variable virtual inductor having its inductance adjusted by a second delay adjust signal, coupled in parallel to the electronically variable capacitance at a node, whereby a signal envelope having a group delay applied to the node is adjusted by the capacitance and inductance such that the group delay is adjusted is provided.

In accordance with still another aspect of the present invention, a group delay adjusting circuit comprising, a means for providing an electronically adjustable variable capacitance, and a means for providing an electronically variable inductance coupled in parallel to the means for providing an electronically adjustable capacitance, whereby the parallel combination includes a first signal node coupled to a signal, and a second ground node coupled to a ground potential, whereby a signal envelope having a group delay applied to the node is adjusted by the electronically adjustable variable capacitance and the electronically adjustable variable inductance such that the group delay is adjusted is provided.

In accordance with still another aspect of the present invention, a method of providing group delay adjustment comprising, adjusting a first parallel variable shunt capacitance having a first terminal and a second terminal coupled to a ground, adjusting a second variable shunt capacitance, and electrically rotating the second variable shunt capacitance to a variable inductance by coupling the variable shunt capacitance to a first terminal of a series transmission line having an electrical length of a quarter wavelength at a frequency of operation, in which a second terminal of the series transmission line is coupled to the first terminal of the first parallel variable shunt capacitance such that the second terminal of the series transmission line provides a variable inductance, whereby the second variable shunt capacitance is transformed into a variable inductance by the series transmission line and group delay is adjusted is provided.

In accordance with still another aspect of the present invention, a method of providing group delay adjustment comprising, setting a first control voltage to a minimum value, adjusting a second control voltage value between the minimum and a maximum second control value to produce a predetermined insertion loss flatness, measure a phase at a low frequency, measure the phase at a high frequency, calculate the group delay, and record the first control voltage, the second control voltage values and group delay is provided.

Many of the attendant features of this invention will be more readily appreciated as the same becomes better understood by reference to the following detailed description considered in connection with the accompanying drawings.

DESCRIPTION OF THE DRAWINGS

These and other features and advantages of the present invention will be better understood from the following detailed description read in light of the accompanying drawings, wherein.

Like reference numerals are used to designate like parts in the accompanying drawings.

DETAILED DESCRIPTION

The detailed description provided below in connection with the appended drawings is intended as a description of the present embodiments of the invention and is not intended to represent the only forms in which the present invention may be constructed or utilized. The description sets forth the functions of the invention and the sequence of steps for constructing and operating the invention in connection with the illustrated embodiments. However, the same or equivalent functions and sequences may be accomplished by different embodiments that are also intended to be encompassed within the spirit and scope of the invention.

Although the present invention of a group delay adjuster is described and illustrated as being implemented in a cellular telephone feedforward amplifier system, the feedforward system described is provided as an example and not a limitation. As those skilled in the art will appreciate, the present invention is suitable for application in a variety of different types of feed forward amplifiers, radio frequency (RF) circuits, microwave circuits and communications systems.

A cellular telephone system typically utilizes feed forward amplifiers to amplify the signal strength of multiple outgoing (outgoing to one or more cellular telephone handsets) calls. The feed forward amplifier is typically located in a cellular telephone base station equipment shed, at the base of a cell site antenna tower.

In addition the group delay circuit is described as being advantageously implemented in microstrip transmission line. However, those skilled in the art will realize that the group delay adjusting circuit may equivalently be implemented with other transmission line structures such as strip line, slab line and the like.

Figure 1:
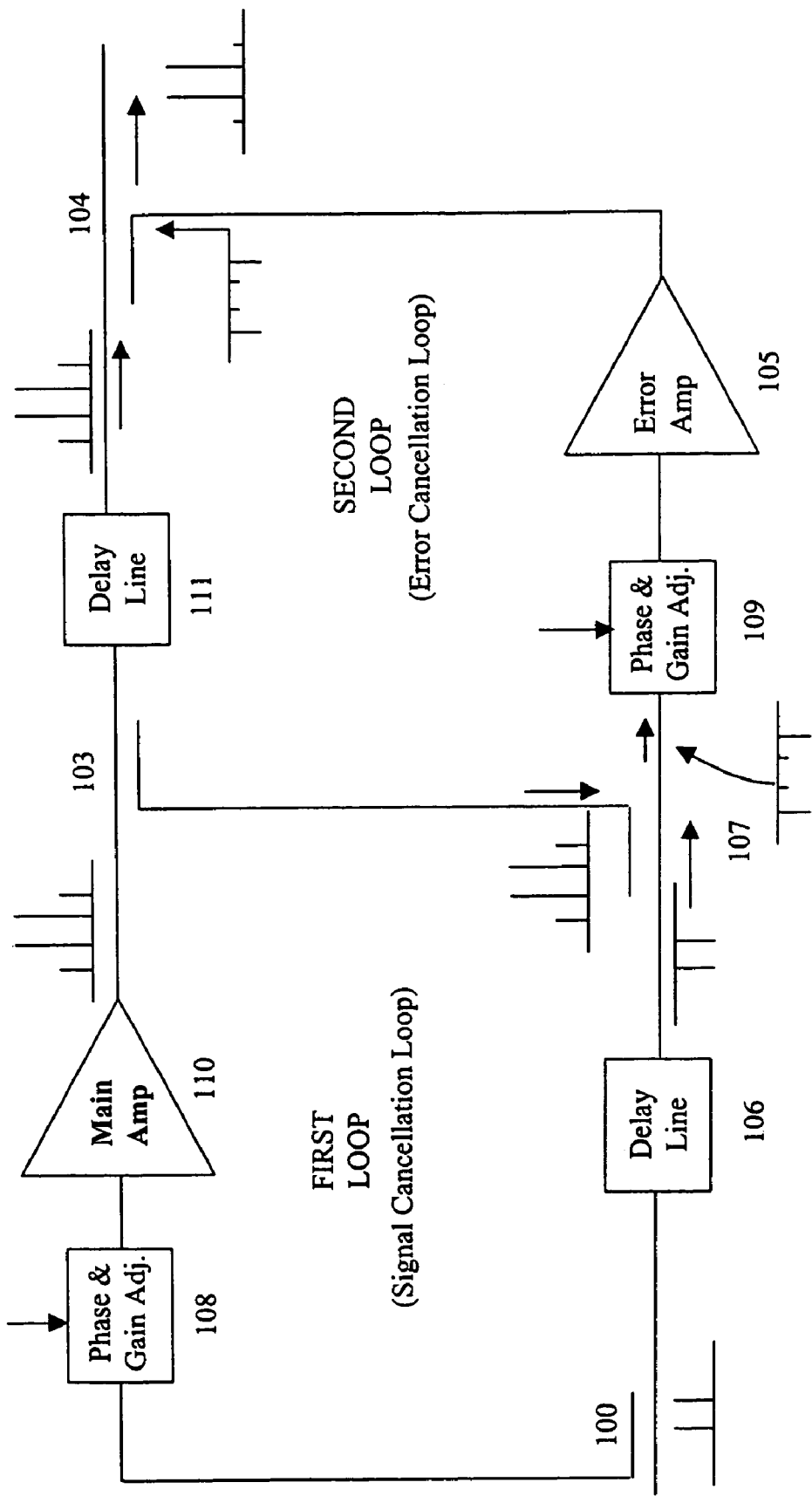
FIG. 1 is a block diagram of a conventional feed-forward amplifier.

FIG. 1 is a block diagram of a conventional feed-forward linear amplifier 101. An input signal is applied to coupler 100 which couples portions of the input signal to delay line 106 and to main amplifier 110. Main amplifier 110 produces an amplified output having intermodulation products generated due to non-linearities in main amplifier 110. A portion of the amplified output signal is coupled to summer 107 by coupler 103. Delay line 106 delays the input signal with respect to the output of the amplifier 110 producing a delayed signal such that the two signals reach summer 107 at substantially the same time, but reversed in phase by 180°.

The output of summer 107 is an error signal which is coupled to error amplifier 105. Error amplifier 105 increases the amplitude of the error signal producing an error correction signal. The error correction signal is matched in amplitude to the intermodulation products (i.e. spurious component) generated by main amplifier 110 and delay line 111, but reversed in phase by 180°. The resultant vector cancellation of the intermodulation products is performed in coupler 104 where the error correction signal is subtracted from the amplified input signal. The vector cancellation must be performed with a high degree of accuracy. If the error correction signal is matched in amplitude and phase to the intermodulation products, the error correction signal tends to completely cancel the intermodulation products of the main amplifier. However, even with the high-precision components used in the amplifier, the error signal in reality cannot completely cancel the spurious component generated by main amplifier 110. In general, a cancellation of substantially 40 dB requires that the error correction signal be maintained with greater than 0.5 degrees phase accuracy and 0.1 dB amplitude accuracy which is difficult to achieve in production.

Figure 2:
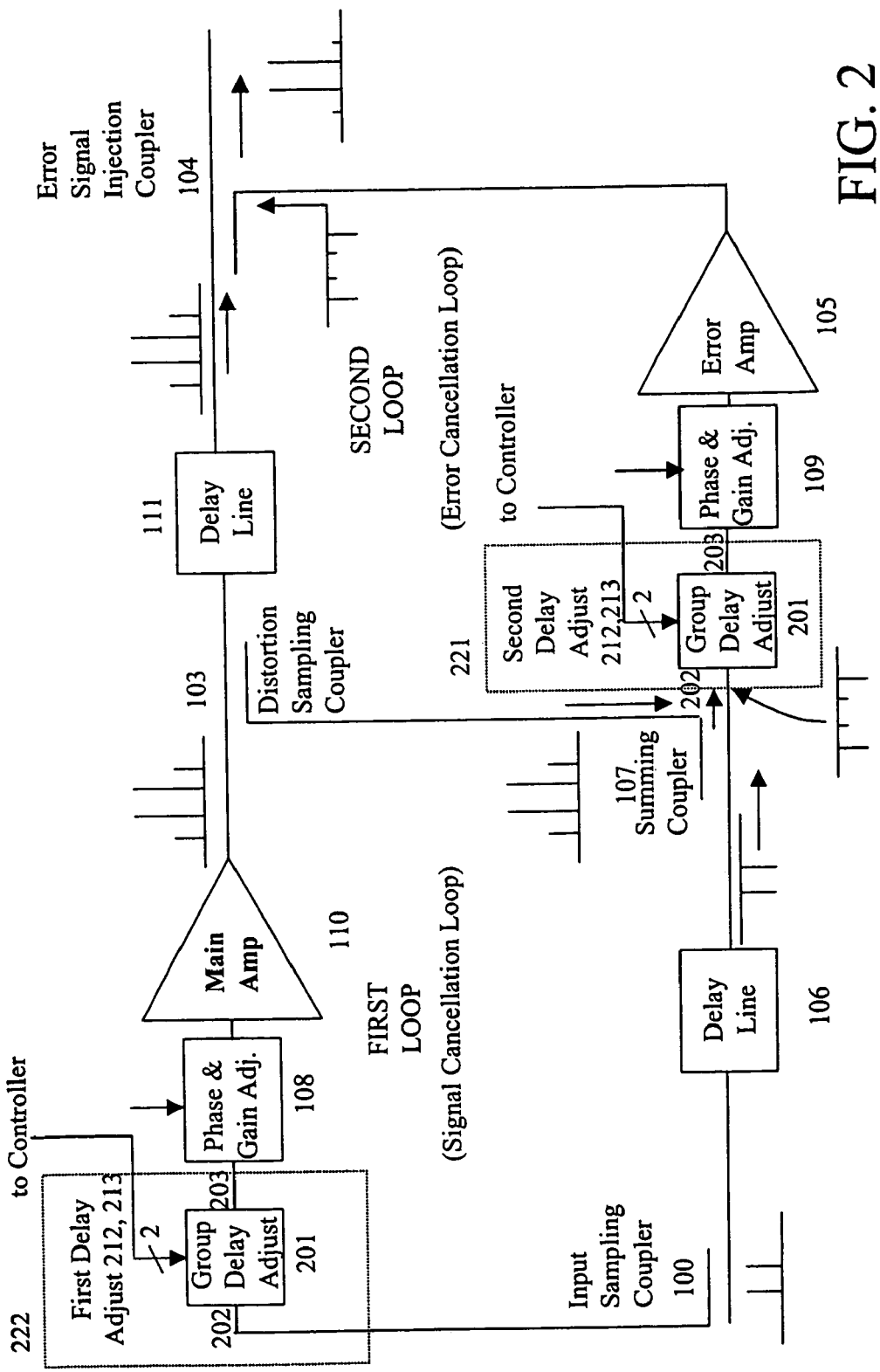
FIG. 2 is a first embodiment of a feed-forward amplifier system having a virtual inductor group delay adjuster circuit.

FIG. 2 is a first embodiment of a feed-forward amplifier system 206 having a virtual inductor group delay adjuster circuit (group delay adjuster circuit) 201. The previously described feed forward amplifier shown has a first group delay adjuster circuits 201 disposed in the first loop at position 222 and a second group delay adjuster circuit 201 disposed in the second loop at position 221. First and second group delay adjusting circuits 201, 221 are similarly constructed, and controlled independently of each other. The first group delay adjusting circuit is disposed in a main amplifier path that includes the first group delay adjuster 201, phase and gain adjuster circuits 108, and main amplifier 110. The second group delay adjusting circuit 201 is disposed in an error amplifier path that includes the second group delay adjuster 221, the second phase and gain adjuster circuits 109, and the error amplifier 105. The first group delay adjuster circuit 201 has an input 202 coupled to the coupled port of the input sampling coupler 100, and an output 203 coupled to an input of the phase and gain adjusting circuit 108. The second group delay adjuster circuit 201 has an input 202 coupled to the output port of the summing coupler 107, and an output 203 coupled to an input of the phase and gain adjusting circuit 109.

In the feed forward amplifier having a group delay adjustment circuit 201 shown, it is desirable to match the characteristics of signal paths in the first and second loops to optimize electrical performance. A method of matching the loops is delay equalization. The first and second group delay circuits tend to allow cancellation in each loop to be improved. A control system (not shown) is typically coupled to various circuit elements such as the phase and gain adjusting circuits 108, 109 via digital or analog control lines. The control lines allow adjustment of the overall amplifier 206, utilizing control methods known to those skilled in the art, to achieve a desired cancellation.

In the embodiment shown the control system controls the first group delay adjustment circuits 201 through a first delay adjustment control. The first delay adjustment control consists of two control signal inputs 212, 213 coupled from the control system to the first group delay adjustment circuit. In the embodiment shown the control system also controls the second group delay adjustment circuit 201 through a second delay adjustment control. The second delay adjustment control consists of two control signal inputs 212, 213 coupled from the control system to the second group delay adjustment circuit. Thus four independent control signals control the two identical group delay adjustment circuits disposed in the amplifier 206. The four control signals operate in cooperation in a manner that tends to optimize cancellation in each loop by adjusting group delay in the corresponding section of the loop. The group delay adjustment circuits advantageously tend to eliminate the lengthy process of delay equalization between the two active and passive sections of each loop.

In the feed forward amplifier system shown 206 the various circuits are typically constructed as modules that are mounted in a rack or chassis in a manner known to those skilled in the art. The modules are coupled together by interconnecting transmission lines or cables, such as coaxial cable. The modules may be constructed in a variety of ways known to those skilled in the art. In particular, microstrip transmission lines are often used advantageously in module construction at radio and microwave frequencies. As will be appreciated by those skilled in the art that microstrip transmission lines may be utilized to connect circuits with a transmission line of known impedance, or may be used to construct various circuit elements such as filters, fixed capacitances, fixed inductances and the like. Microstrip circuits are typically easy to manufacture, tending to reduce overall amplifier construction cost. Thus, it would be desirable to be able to construct a group delay adjusting circuit with microstrip transmission line circuitry.

Figure 3:
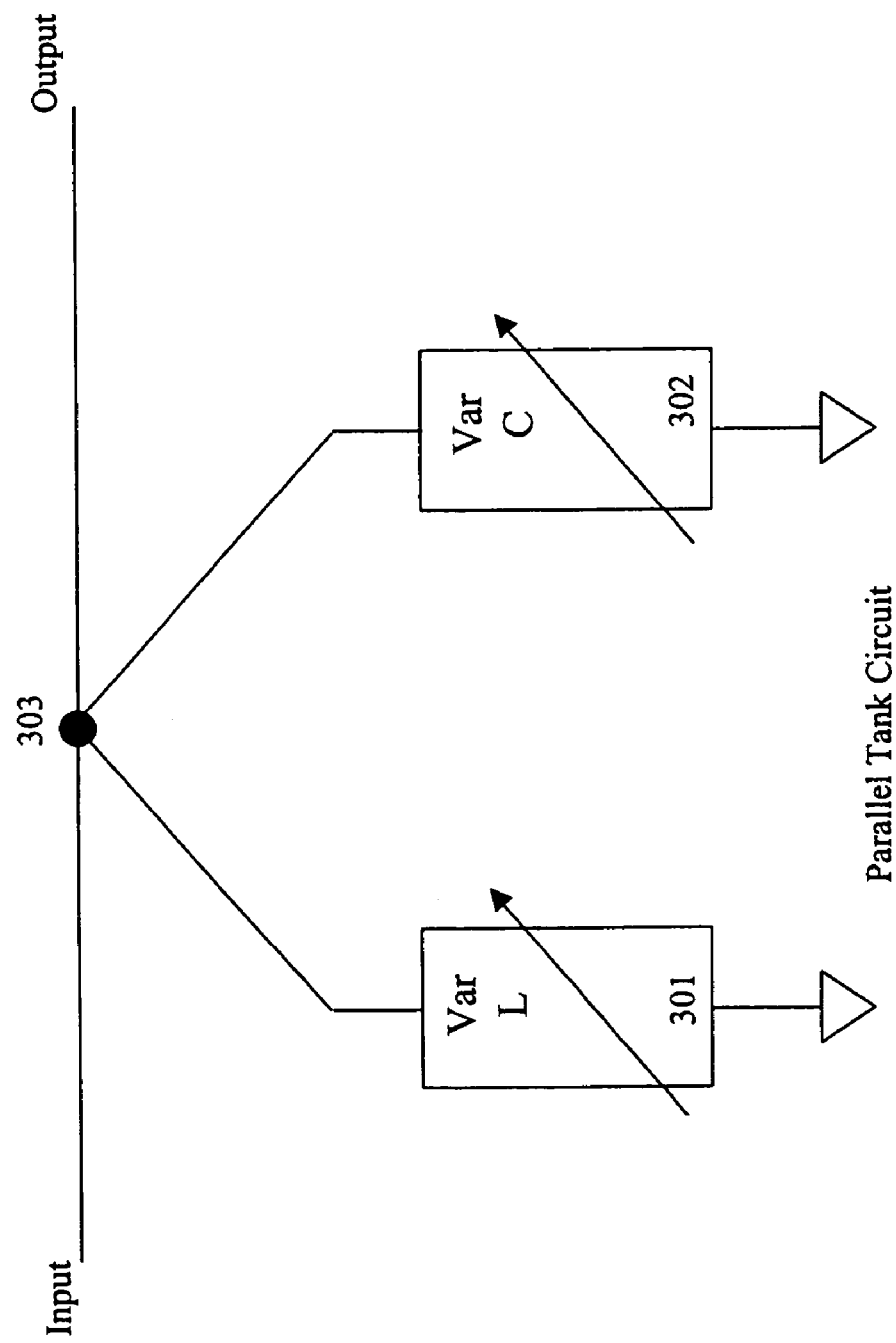
FIG. 3 is a block diagram of a conventional group delay adjustment circuit.

FIG. 3 is a block diagram of a conventional group delay adjustment circuit. The parallel variable inductance 301 and variable capacitance 302 circuit (parallel LC circuit) shown is suitable for adjusting group delay. In the circuit shown a first terminal of the variable inductance 301 and a first terminal of the variable capacitance 302 are coupled to a common node 303. The second terminal of each component 301, 302 is coupled to a ground. A signal input to node 303 undergoes a change in group delay when it appears at the output, due to the effects of the variable inductance 301 and the variable capacitance 302.

The two adjustable components shown provide a continuously variable phase shift depending upon the values of each component. A circuit having a slope variable phase shift over a desired frequency range, such as the parallel LC circuit, may be used to adjust group delay. However, there are disadvantages to this approach. A primary disadvantage relates to the inductance; fixed and variable inductors are typically difficult to build and adjust. In particular variable inductors are poorly suited for electronic control in varying their inductance. It is desirable to have a group delay that provides the group delay adjustment range of a parallel LC circuit, has an inductance that is electronically adjustable, and is easily manufactured.

Figure 4:
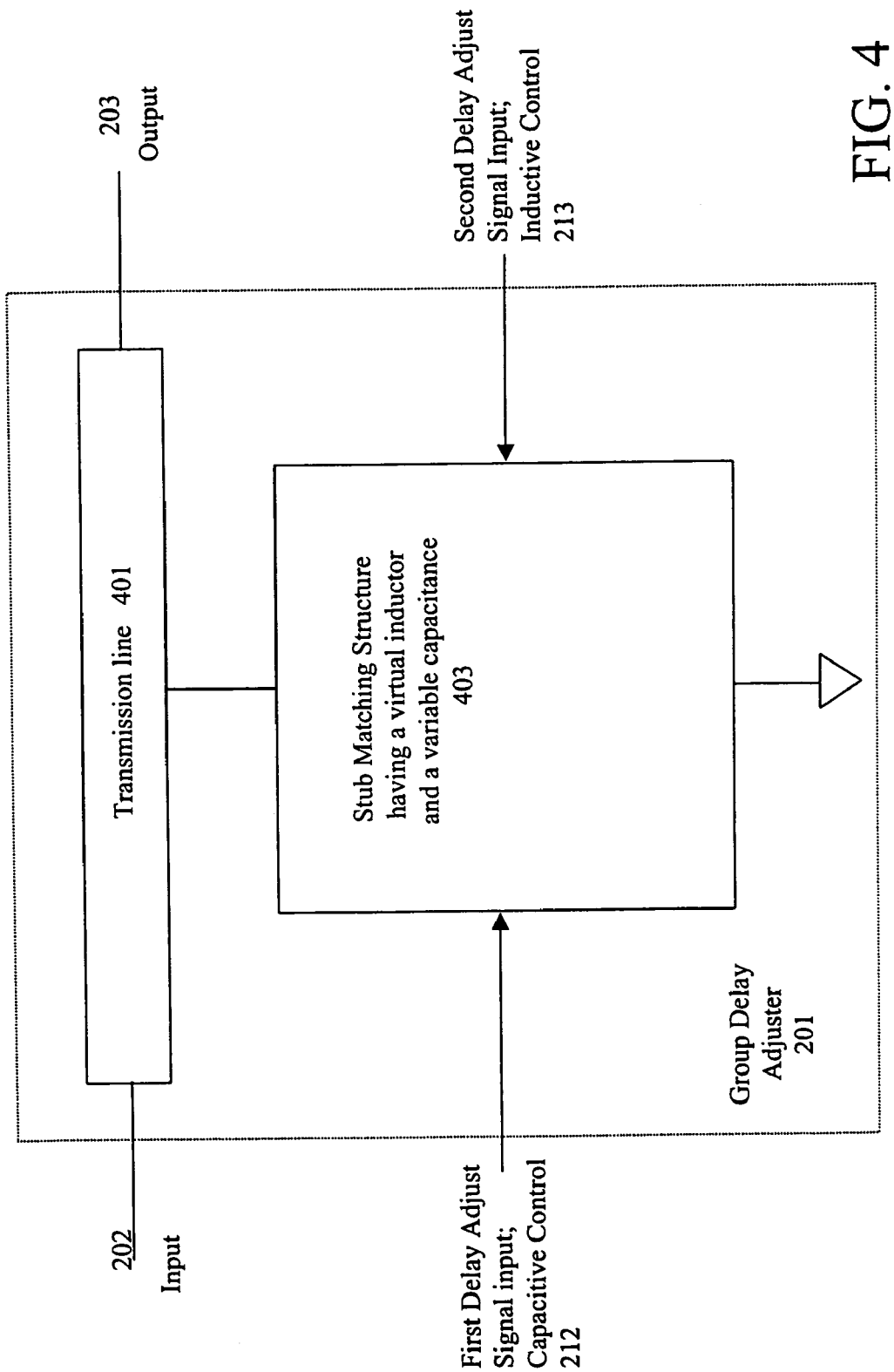
FIG. 4 is a block diagram of an embodiment of a group delay adjustment circuit having a stub matching structure.

FIG. 4 is a block diagram of an embodiment of a group delay adjustment circuit 201 utilizing a microstrip transmission line 401, and having a stub matching structure 403. The stub matching circuit is constructed to provide a variable inductance, without a variable inductor. By using a structure incorporating a variable capacitor that can be used to create a variable inductance circuit complexity tends to be greatly reduced. The group delay adjustment circuit shown advantageously utilizes microstrip circuitry, electronic tuning, and the elimination of inductors to achieve the group delay adjustment range of a parallel LC group delay adjustment circuit without using inductors.

A conventionally constructed transmission line 401 is coupled to an input 202, and an output 203. The transmission line 401 is constructed to have a characteristic impedance matched to the impedances seen at the input 202 and the output 203. The transmission line may be implemented in a variety of forms including microstrip, stripline, slab line and the like. In the embodiment shown the transmission line is a microstrip transmission line having a characteristic impedance of 50 Ohms. Those skilled in the art will realize that values of characteristic impedance other than 50 Ohms may be used. For example a characteristic impedance of 75 Ohms is commonly used in television circuitry.

A stub matching structure (including a virtual inductor) 403 is coupled to the conventionally constructed transmission line 401 through a first terminal of the stub matching structure that includes a virtual inductor. A second terminal of the stub matching structure having a virtual inductor is coupled to ground. Thus, the stub matching structure having a virtual inductor 403 is shunted from the transmission line to ground. The stub matching structure includes two reactances: a virtual inductor 403 that provides a variable inductive reactance, and a variable capacitive reactance. Each reactance is shunt coupled to the transmission line 401.

At the point the variable capacitance and the variable virtual inductance couple to the transmission line, a variable capacitive reactance, and a variable inductive reactance is seen at that point by a signal propagating along the transmission line 401.

A first delay adjust signal input, or capacitive control signal 212 is coupled to the stub matching structure having a virtual inductor 403. The first delay adjust signal input 212 provides electronic control of the variable capacitance contained in the stub matching structure having a virtual inductor 403.

A second delay adjust signal input, or inductive control signal 213 is coupled to the stub matching structure having a virtual inductor 403. The second delay adjust signal input 213 provides electronic control of the virtual inductance contained in the stub matching structure having a virtual inductor 403. Those skilled in the art will realize that circuits of the nature include connections, or terminals, for the application of bias, or power supplies. The bias supply connections, and circuitry will be described in detail in the later figures. Typically the first and second delay adjust signals are variable voltages that change the impedances in proportion to the voltage applied to on each signal line. However those skilled in the art will appreciate that in alternative embodiments a variable current could be applied to a current to voltage converter circuit (not shown) to cause the impedances to vary. In a further alternative embodiment the control signals may be digital signals applied to a digital to analog converter (DAC) (not shown) to provide a suitable control signal, such as a voltage, at the group delay adjuster circuit 201.

It is important to note that the first delay adjust signal input, or capacitive control signal 212 is adjusting the circuit capacitance of the group delay adjusting circuit. It is also important to note that the second delay adjust signal input, or capacitive control signal 213 is adjusting the inductance of the group delay adjusting circuit, and is not simply functioning as a capacitive control signal. This is possible because the "virtual inductor" contained in the stub matching structure having a virtual inductor and a variable capacitance 403, utilizes a capacitor and associated circuitry that allows the adjustment of a capacitor in the virtual inductor to appear to the group delay adjusting circuit to be the adjustment of an inductor.

In an embodiment the first and second delay adjustment signals may be applied conjunctionally. Conjunctionally, means that two control voltages are applied at the same time in a functionally predetermined characteristic known to those skilled in the art. It is important to realize that one voltage is used to control a capacitive reactance in the circuit, and the other voltage is use to control an inductive reactance in the circuit. Typically the voltages will not be equal as the amount of voltage needed to change each reactance to the desired value will be substantially different, requiring the generation of differing voltages. And for the interconnections described in this specification the control voltages will typically have the same polarity or sign. Thus by utilizing a pair of conjunctional control voltages, a method of electronically controlling the Q of a circuit using conjunctionally positive control voltages in order to achieve group delay control. A conjunctional positive inductive control signal and a conjunctional positive capacitive control signal are used to adjust the group delay, where both signals may typically have the same polarity, or sign. In the embodiments shown the control voltages tend to be of the same positive sign, and are not required to be proportional to each other so that the inductance of the virtual inductor may be adjusted independently of the capacitor.

Figure 5:
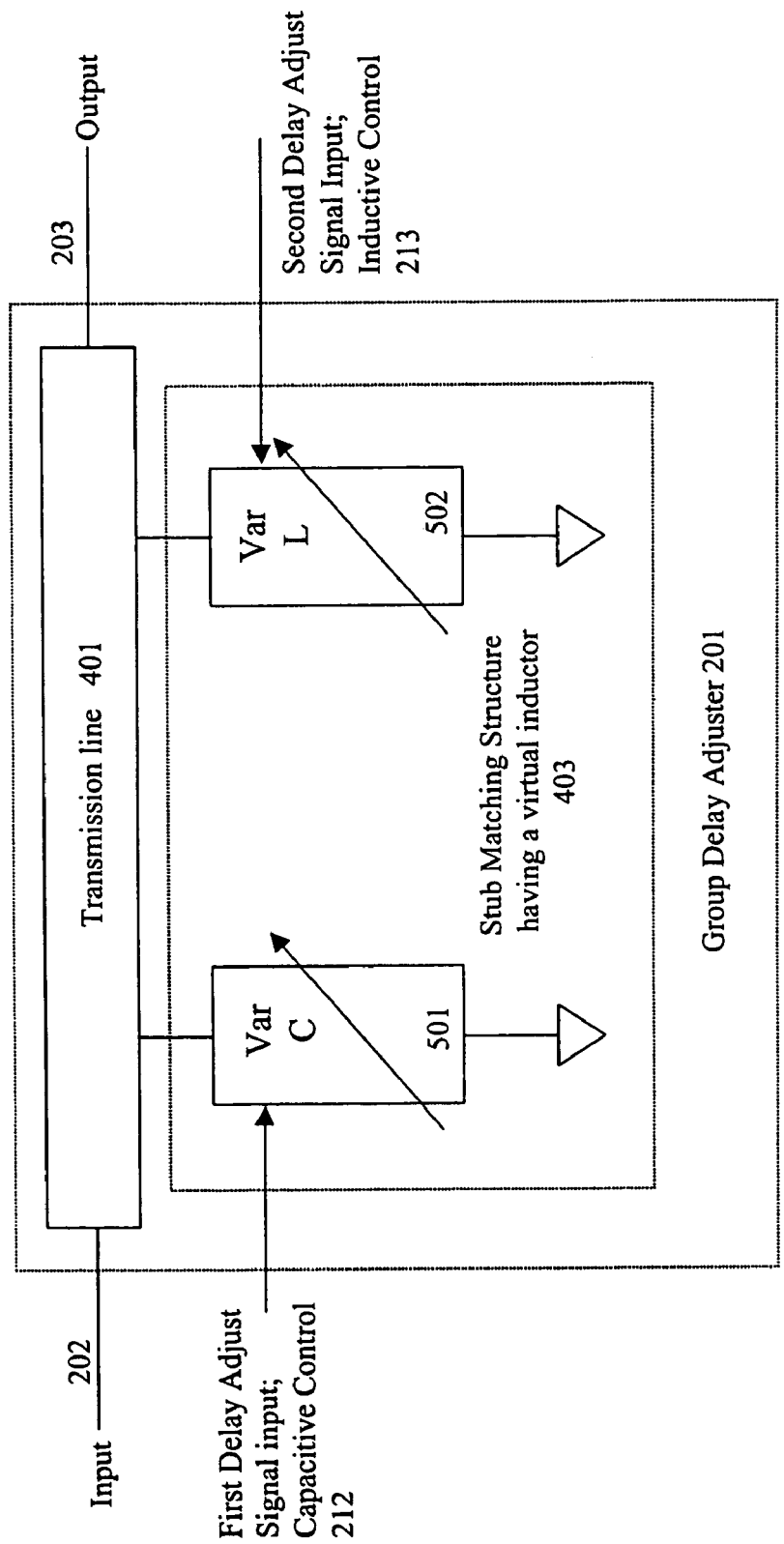
FIG. 5 is a block diagram of an embodiment of the stub matching circuit having a virtual inductor.

FIG. 5 is a block diagram of an embodiment of the stub matching circuit having a virtual inductor. The virtual inductor is a circuit structure that utilizes a variable capacitance to produce a variable inductance, or inductive impedance at the terminal of the virtual inductor. This figure shows the internal structure of the stub matching structure having a virtual inductor 403, and how it functions in relation to the group delay adjuster circuit 201. The virtual inductance is contained in the variable inductance block 502. The first delay adjust signal input, or capacitive control 212 is coupled to the variable capacitance 501. The second delay adjust signal input, or inductive control 213 is coupled to the variable virtual inductance 502. The variable capacitance 501 is shunt coupled from the transmission line 401 to ground. The variable virtual inductance 502 is shunt coupled from the transmission line 401 to ground.

Figure 6:
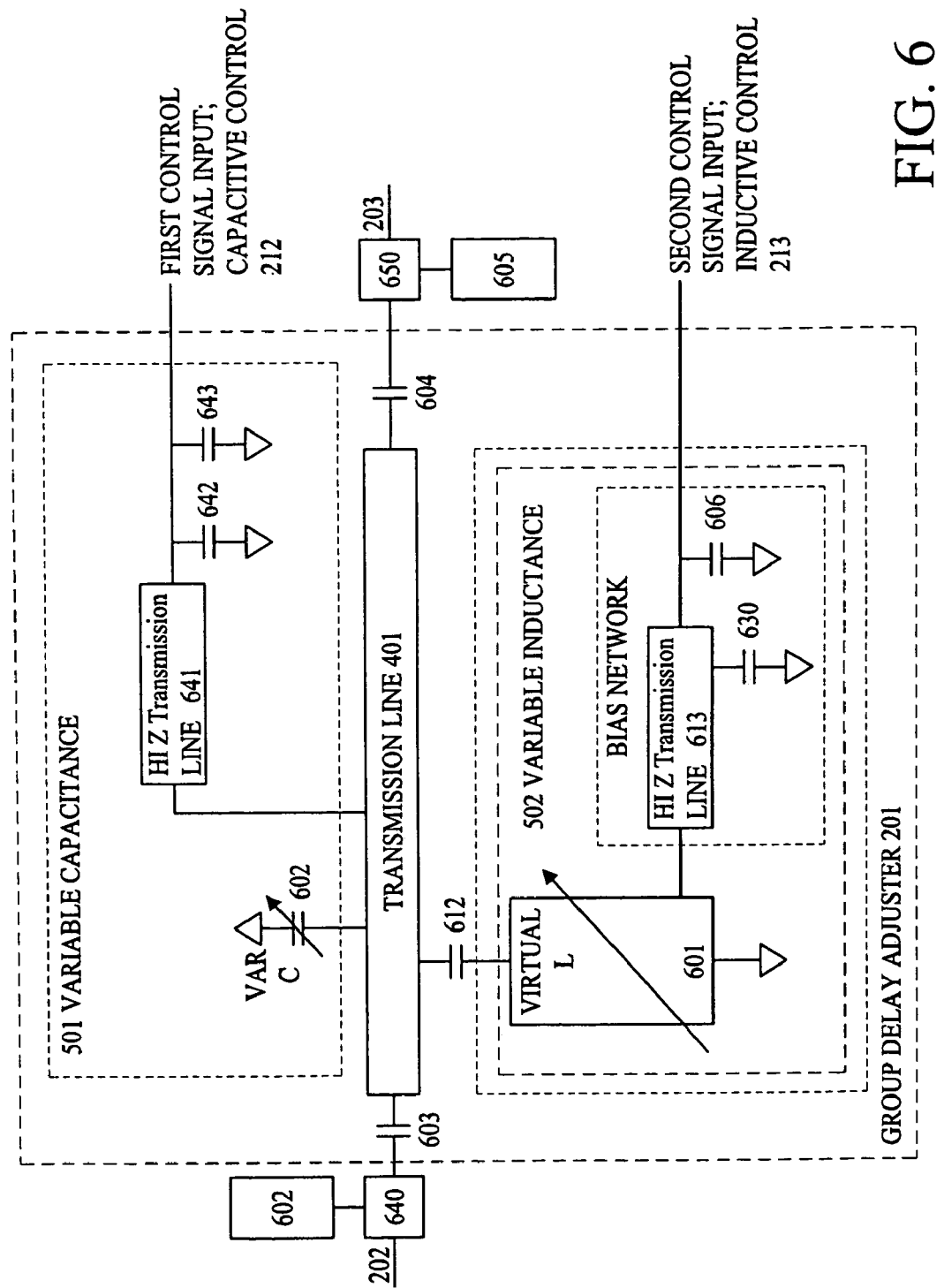
FIG. 6 is a block diagram of the group delay adjustment circuit showing the construction of the variable virtual inductance and variable capacitance.

FIG. 6 is a block diagram of the group delay adjustment circuit showing the construction of the variable virtual inductance 502, variable capacitance 501, and supporting circuits. A transmission line 401 includes a pair of conventionally constructed matching circuits 602, 605 coupled to a transmission line input 640 and to a transmission line output 650, respectively. In the embodiments shown the matching circuits 602, 605 are constructed from microstrip transmission line. A pair of conventionally constructed DC blocking capacitors 603, 604 are disposed between input transmission line 640 and a first input of transmission line 401, and between an output of a second terminal of the transmission line 401 and an output of transmission line 650 respectively.

The variable capacitance circuit 501 includes a variable capacitance 602 having a first terminal coupled to the transmission line 401 and a second terminal coupled to ground. In the embodiment shown the variable capacitance 602 is a varactor diode. Those skilled in the art will appreciate that a varactor diode, is a diode that has a substantial capacitance associated with it and is utilized to provide a voltage adjustable capacitance.

The varactor diode 602, in the variable capacitance circuit 501, is capable of providing a varying capacitance depending upon a capacitive control voltage 212 established across the diode. Equivalently, a varactor configuration where current flow through the varactor diode is present could be used. In the embodiment shown the voltage 212 is allowed to be applied to diode 602. Placing conventionally constructed DC blocking capacitors 603, 604, 612 to interrupt the flow of current to other portions of the circuit. The selection of capacitance values is dependent upon the frequencies present. The selection of capacitance values is done by methods known to those skilled in the art.

A high impedance transmission line 641 is typically utilized in conjunction with one or more signal bypass capacitors 642 and 643 to prevent leakage of signals present on the transmission line 401 onto the capacitive control line 212. The high impedance transmission line 641 is designed by methods known to those skilled in the art to block, or isolate, a desired band of signals from passing through it. To remove any residual signals that have made it past the transmission line 401, one or more shunted bypass capacitors 642, 643 having values selected by methods known to those skilled in the art, are disposed at the end of the high impedance transmission line 641 to shunt the remaining signal to ground. Those skilled in the art will realize that the bypass capacitor 642 is chosen to have a low impedance at the desired band of signals, and a high impedance at the slowly varying voltage level of the capacitive control signal 212.

The high impedance transmission line of the variable capacitance circuit 641 includes a first port coupled to the transmission line 401. A second port of the high impedance transmission line 641 is coupled to the capacitive control signal line 212. Those skilled in the art will appreciate that an equivalent circuit that provides a high series impedance at high frequencies may be substituted for the high impedance transmission line 641. In the embodiment shown the high impedance transmission line is constructed in microstrip. However those skilled in the art will realize that other transmission line types may be equivalently substituted for microstrip transmission line.

The bias line devised from a high impedance transmission line 613 is conventionally constructed and functions in a manner similar to a radio-frequency choke (a device known to those skilled in the art.) A choke is a frequency selective device allowing direct current (DC), or slowly varying electrical control signals to pass through while simultaneously rejecting rapidly varying radio frequency (RF) signals. Alternately, a series choke, inductor, or the like that allows DC or varying control signals to pass may be equivalently substituted for the choke 613, 641. In this manner RF, signals do not interfere with the circuitry generating the control signal.

Capacitors 630, 606 are coupled at various points on the transmission line. Bypassing can be provided by one or more capacitors. The purpose of bypass capacitors is to provide RF bypassing of radio frequency signals to ground. Bypassing can be performed, as known to those skilled in the art, by one or more capacitors to selectively eliminate undesired RF signals. Node 213 is the input of a DC control signal. This DC signal is varied, as necessary, to control the desired characteristic value of virtual inductor 601.

The virtual inductor 601, of the variable inductance circuit 502, includes a second terminal coupled to ground and a first terminal coupled to a first terminal of a DC blocking capacitor 612. The DC blocking capacitor 612 includes a second terminal coupled to the transmission line 401. DC blocking capacitor is conventionally constructed, with a value of capacitance chosen appropriate to the frequency of operation, as will be appreciated by those skilled in the art. Virtual inductor 601 includes a third terminal coupled to a first terminal of a high impedance transmission line 613. The third terminal of virtual inductor 601 is a control signal input.

A virtual inductor 601 of the variable inductance circuit includes in its construction a variable capacitance (not shown) constructed similarly to capacitance 602. The variable capacitance includes a second terminal shunt coupled to ground and a first terminal coupled in series with a first terminal of a quarter wavelength transmission line (not shown). A second terminal of the quarter wavelength transmission line forms the first terminal of the virtual inductor 601. In the exemplary embodiment shown virtual inductor 601 utilizes a varactor diode (previously described) that produces an electronically variable capacitance. In an alternative embodiment multiple varactor diodes are utilized to produce an overall desired capacitance.

A high impedance transmission line 613 of the variable inductance circuit is constructed similarly to that of high impedance transmission line 641. A first terminal of the high impedance transmission line 613 is coupled to the third terminal (control signal input) of the virtual inductor 601.

Bypass capacitors 630, 606 of the virtual inductance circuit 502 shunt any remaining signal energy present at the second terminal of the high impedance transmission line 613 to ground to prevent it from traveling any further down the inductive control signal line coupled to the inductive control signal terminal 213. Bypass capacitors 630, 606 are conventionally constructed, with values of capacitance chosen appropriate to the frequency of operation, as will be appreciated by those skilled in the art. Bypass capacitor 630 includes a second terminal shunted to ground and a first terminal coupled along the length of the high impedance transmission line 613, typically in the vicinity of the second terminal of transmission line 613. Bypass capacitor 606 includes a second terminal shunted to ground and a first terminal coupled along the length of the high impedance transmission line 613, typically in the vicinity of the second terminal of transmission line 613. As used throughout this application shunting a component to ground or grounding a component are synonymous terms that include direct coupling to ground as well as indirect coupling to ground via an open circuited quarter wavelength stub, a shortened fan shaped open stub, or other equivalent methods known to those skilled in the art.

Figure 7:
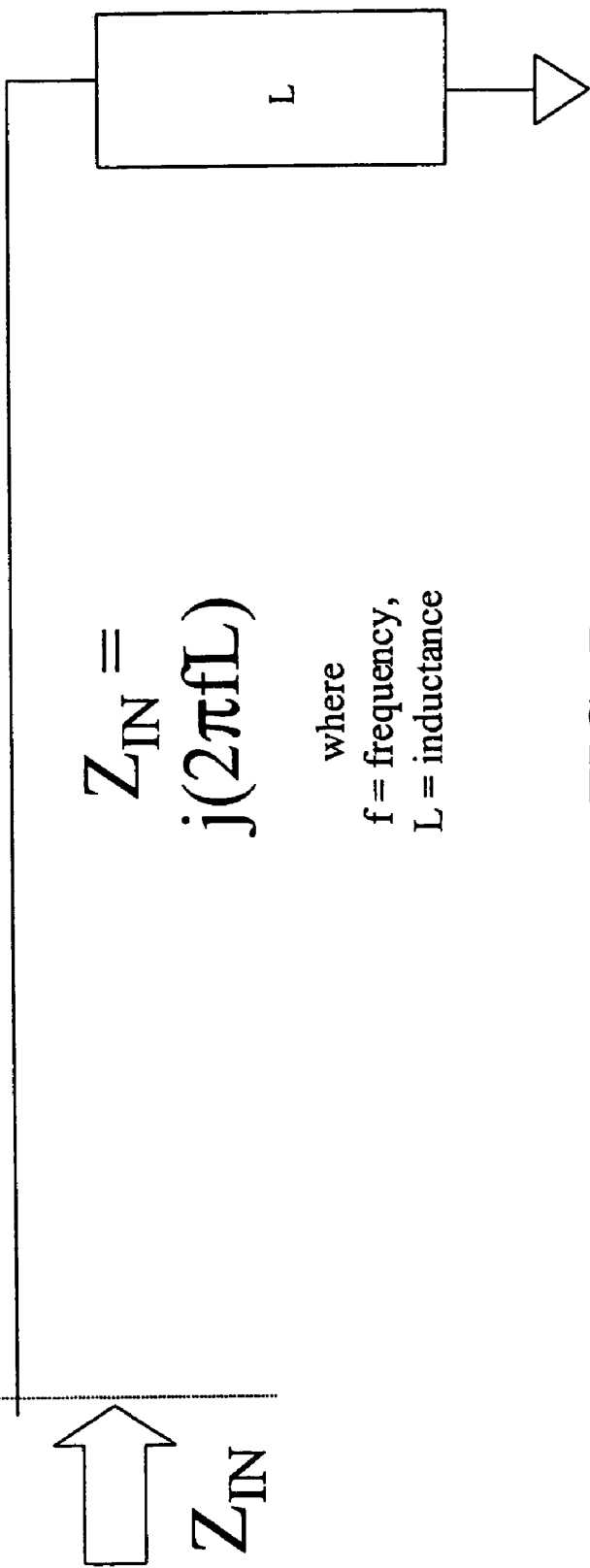
FIG. 7 is an illustration showing the terminal impedance of a shunt inductor having negligible lead length at high frequency.

FIG. 7 is an illustration showing the terminal impedance of a shunt inductor having negligible lead length at high frequency. The value $Z_{IN}$ represents the terminal impedance of the inductor, L, at the frequency of operation at a first terminal. A second terminal of L is coupled to ground. Input impedance, $Z_{IN}$, is a function of inductance, L, and frequency, f, according to the relationship $Z_{IN}=jX=j(2\pi fL)$. Impedance is a vector quantity, with real and imaginary components. The full form for expressing input impedance, in general, is $Z_{IN}=R+/-jX$, where X is capacitive or inductive reactance, and R is a resistive part. (In FIG. 7, R=0.) An inductive reactance is +jX, and a capacitive reactance is -jX.

For any given frequency, input impedance changes proportionally to inductance. Input impedance can be adjusted by varying the inductance. Inductors can be constructed in many ways. However, these conventional ways of constructing inductors are typically difficult to integrate onto a semiconductor substrate or printed wiring assembly. Examples of typical inductors include, wire wound elements with or without cores, and metallic traces, disposed in spiral patterns, on printed circuit boards. Producing an inductor that is capable of having its inductance varied adds another level of complexity to these designs further reducing their usefulness. It is desirable to provide an inductive terminal impedance that is easy to fabricate without using a conventional inductor.

Figure 8:
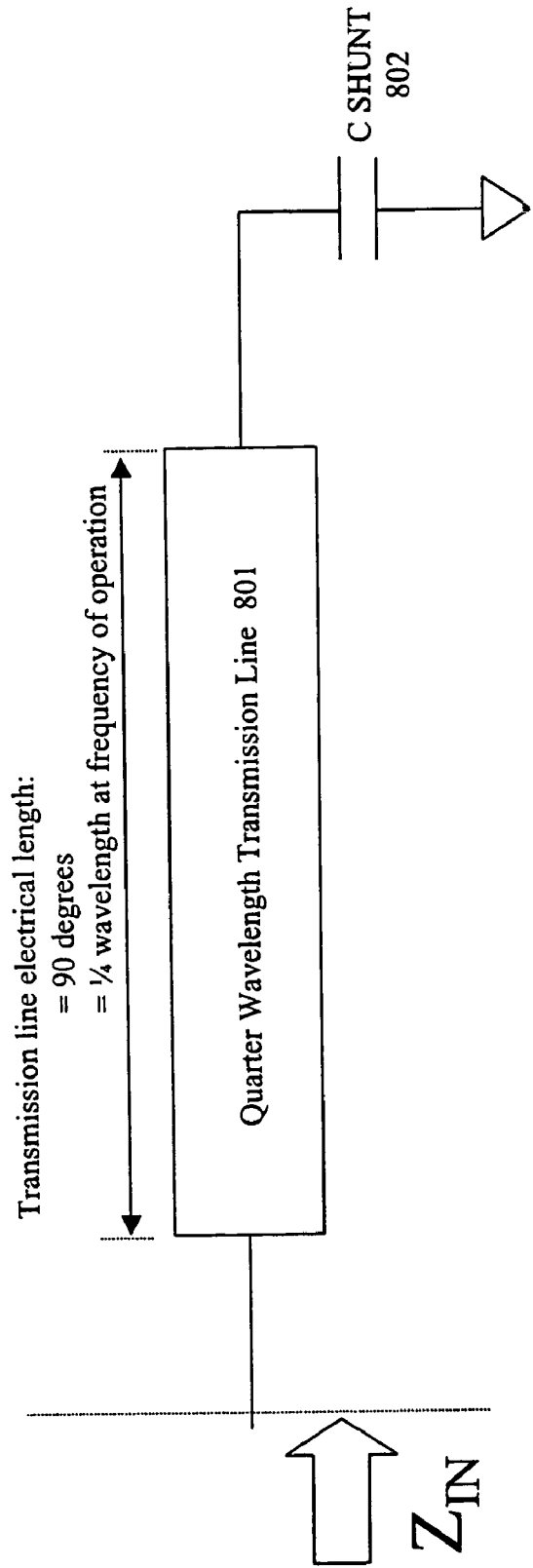
FIG. 8 is an illustration showing the terminal impedance of a network having a quarter wavelength transmission line the high frequency coupled to a shunt capacitor.

FIG. 8 is an illustration showing the terminal impedance of a network having a quarter wavelength transmission line, 801, coupled to a shunt capacitor 802. By introducing a phase shift of ninety degrees, as provided by the transmission line 801, the sign of a capacitive impedance of capacitor 802 ($C_{SHUNT}$) can be changed from a negative (capacitive), to a positive inductive impedance. Thus, a capacitor plus a phase shift may be made to appear as an inductor, at an input terminal of the phase shifting transmission line.

A first input terminal of the quarter wavelength transmission line 801 is labeled $Z_{IN}$. The opposite end of transmission line 801 forms a second transmission line terminal that is coupled to a first terminal of a capacitor, 802. A second terminal of the capacitor 802 is coupled to a ground potential or terminal. Input impedance, $Z_{IN}$, is a function of the electrical properties of the transmission line and the coupled capacitor.

The transmission line 801 is designed to have a length of a quarter wavelength at a desired frequency of operation. Equivalent transmission lines can be constructed in a variety of different ways, as well known to those skilled in the art. Examples include, but are not limited to, etched metal on a printed circuit board (microstrip, stripline, etc.) and self contained structures (like coaxial cable, open wire line, etc.)

The capacitor 802 disposed at the end of the transmission line may be fixed or variable. Capacitor 802 can also be constructed in a variety of ways. Examples include, but are not limited to, lumped element devices, parallel plate capacitors, variable capacitance diodes (varactor or PIN types), and interdigitated structures realized as metallic traces on printed circuit boards. In the case of variable elements, a physical or electrical parameter is varied to affect the change in value.

As shown in the figure, a quarter wavelength transmission line having a purely capacitive termination, results in inductive impedance at its input terminal.

Transforming the sign of an impedance is typically performed by inserting a quarter wavelength of a transmission line in front of an impedance being transformed. As is known by those skilled in the art, the transformation is performed as described in the following paragraphs. For a conventional transmission line having very little loss and a characteristic impedance of $Z_0$, with a shunt load ($Z_t$) at the end of the transmission line, those skilled in the art will recall that the impedance looking into the other end of the transmission line ($Z_{inp}$) is found from evaluating a set of transmission line equations to be:

$$\frac{Z_{inp}}{Z_0} = \frac{\frac{Z_t}{Z_0} + \tanh(j\beta)l}{1 + \frac{Z_t}{Z_0}\tanh(j\beta)l} \quad (1)$$

Where $$\beta = \frac{2\pi}{\lambda}. \quad (2)$$

Utilizing a trigonometric identity removes the complex number from the argument of the trigonometric function, and transforms the hyperbolic function to a conventional tangent function: tan h jx=j tan x. The expression becomes:

$$\frac{Z_{inp}}{Z_0} = \frac{\frac{Z_t}{Z_0} + j\tan\beta l}{1 + \frac{Z_t}{Z_0}j\tan\beta l} \quad (3)$$

For the quarter wavelength transmission line, $$l = \frac{\lambda}{4}, \text{ and} \quad (4)$$

$$\beta l = \left(\frac{2\pi}{\lambda}\right)\left(\frac{\lambda}{4}\right) = \frac{\pi}{2}$$

Inserting these values results in:

$$Z_{imp} = Z_0\left[\frac{\frac{Z_t}{Z_0} + j\tan\frac{\pi}{2}}{1 + \frac{Z_t}{Z_0}j\tan\frac{\pi}{2}}\right] \quad (5)$$

where: tan π/2=∞ yields a solution of infinity divided by infinity for $Z_{imp}$, an indeterminate form that requires the application of L'Hôpital's Rule to attempt to find a solution. However, with the application of L'Hôpital's Rule a second indeterminate form is obtained as well. With a second application of L'Hôpital's rule a solution is found:

$$Z_{inp} = Z_0 \frac{1}{\frac{Z_t}{Z_0}} \quad (6)$$

$$Z_{inp} = \frac{Z_0^2}{Z_t} \quad (7)$$

Those skilled in the art will realize that by having an impedance in the denominator that is a complex number, that the sign of the impedance is changed. Inductors are represented by a positive impedance, and capacitors are represented as negative impedances. Thus, a capacitor can be made to look like an inductor, and an inductor can be made to look like a capacitor by inserting a quarter wavelength transmission line in front of it. If a capacitor is chosen as a terminating impedance, $Z_1$, the impedance becomes:

$$Z_1 = -j\omega C_{SHUNT} = -j2\pi f C_{SHUNT} \quad (8)$$

Substituting the reactance of the capacitor into the expression for the input impedance of the quarter wave transmission line having the capacitive load yields:

$$Z_{inp} = \frac{Z_0^2}{-j\omega C} = j\frac{Z_0^2}{\omega C} = j\frac{Z_0^2}{2\pi f C} \quad (9)$$

As can be seen, by applying the rules relating to complex numbers (j=√−1) where 1/j=−j, the sign of the impedance is transformed by the addition of the quarter wavelength line in front of the load $Z_t$. The shunt capacitor 802 reduces the total capacitive reactance making the resultant input impedance inductive.

In summary, for the network shown, the combination of a quarter wavelength transmission line 801 and a shunt capacitor 802 tends to result in an inductive impedance value for $Z_{IN}$. As viewed at the input terminal $Z_{IN}$, the network behaves as an inductor.

Figure 9:
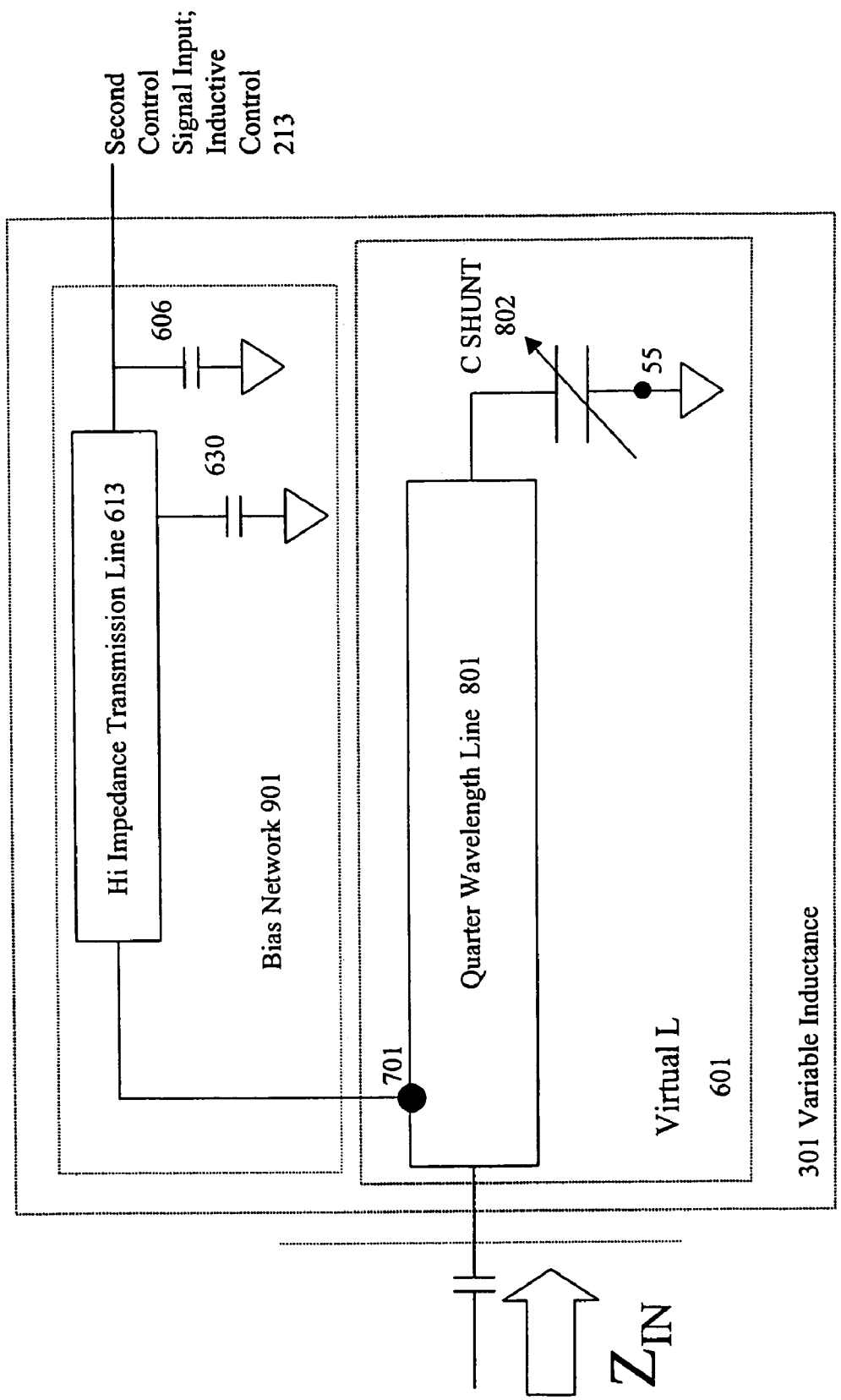
FIG. 9 is a block diagram showing the terminal impedance of a variable inductance virtual inductor.

FIG. 9 is a block diagram showing a variable inductance 301 having a virtual inductor 601. The impedance $Z_{IN}$ at the input terminal of the variable inductance 301 is that of the virtual inductor 601 coupled to the input terminal of the variable inductance 601.

A bias network 901 is coupled to the virtual inductor 601 adjacent to the point 701 where the virtual inductor is coupled to the input terminal of the variable inductance 301. The point of attachment 701 is chosen to have a high impedance (as seen by the bias network). The point of attachment, and the bias network are found utilizing methods known to those skilled in the art, such that signal leakage through the bias network tends to be minimized.

The previously introduced bias network includes a conventionally constructed length transmission line ("bias line"), 613, having high characteristic impedance $Z_{HI}$. Impedance $Z_{HI}$ is typically chosen, as will be appreciated by those skilled in the art, to be several orders of magnitude greater then that of the transmission line 801, being coupled to at a coupling point 701. Equivalently, a series impedance may be substituted for the transmission line. A first terminal of the bias network 901 is coupled to the virtual inductor, 601, at point 701.

A second terminal of the bias line 613 is coupled to a first terminal of a first shunt bypass capacitor 630, and a first terminal of a second shunt bypass capacitor 606 at second control signal input 213. A second terminal of bypass capacitor 606 is coupled to ground. Node 213 is the second control signal input, coupled to an externally supplied inductive control. It is used to change the inductance seen at $Z_{IN}$. A second shunt bypass capacitor, 630, includes a first terminal coupled to a point on the bias line 613, and having a second terminal coupled to ground. Equivalently other bias networks that allow DC to flow into a high frequency circuit, while preventing the loss of high frequency energy may be substituted for bias network 901.

Virtual inductor 601 includes a quarter wavelength transmission line, 801, and a shunt capacitor, 802. One terminal of the quarter wavelength transmission line 601 is connected to the variable inductance input $Z_{IN}$, the other end to a first terminal of variable shunt capacitor ($C_{SHUNT}$), 802. The bias network 901 is coupled to the transmission line 801 at a high impedance point along its length. A second terminal of the variable capacitor 802 is connected to ground at node 55.

The virtual inductor, 601 includes a conventionally constructed quarter wavelength transmission line 801 having a first input terminal coupled to the input terminal $Z_{IN}$. The quarter wavelength transmission line 801 is substantially a quarter wavelength long at a frequency f, of operation. The frequency of operation is typically chosen at mid-band of a desired signal bandwidth of operation. In the embodiment shown the quarter wavelength transmission line is constructed from microstrip. However, other types of transmission line as known to those skilled in the art may be utilized instead of microstrip transmission line. Examples include, but are not limited to, etched metal on printed circuit board (microstrip, stripline, etc.) and self-contained structures (like coaxial cable, open wire line, etc.) In the embodiment shown the transmission line is built from microstrip.

Capacitor 802 is a variable shunt capacitance, previously introduced. The capacitor can also be constructed in a variety of ways. Examples include, but are not limited to, tunable parallel plate or coaxial capacitors, variable capacitance diodes, and any other possible realizations of tunable capacitors. Varying the shunt capacitance varies the resulting inductive impedance. Since precision, electrically tunable capacitors can be more easily fabricated than mechanically variable inductors, this method has great advantage over using tunable inductors. In the embodiment shown one or more voltage variable capacitance (or "varactor") diodes are utilized to produce a variable capacitance.

The variable inductance, 301, works as follows. A control signal is applied at node 213. This may be a DC signal which passes through the high impedance transmission line, 613, and coupled at node 701 to transmission line 801 in the virtual inductor network, 601. Any radio frequency energy incident on this control line is grounded via capacitors 630 and 606. The DC control signal passes through the quarter wavelength transmission line, 801, to the variable capacitor 802. The DC control signal changes the capacitance, which in turn changes the inductance of Virtual L network, 601. The principal here is to vary the shunt capacitance on the end of the transmission line to effectively change the resulting inductive reactance. In this way, the circuit behaves like a virtual inductor.

Figure 10:
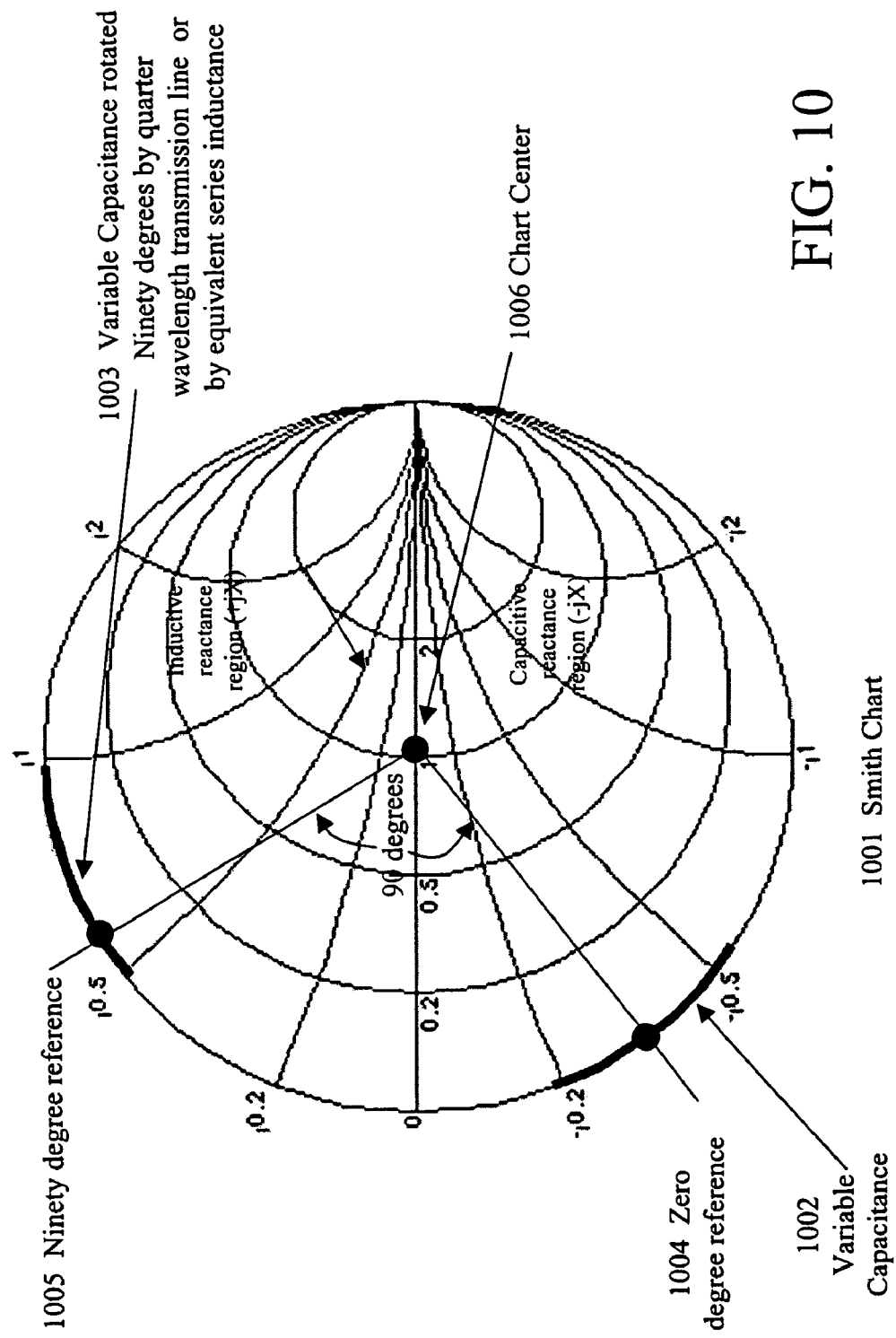
FIG. 10 is a Smith chart representation of an impedance seen at the input of a virtual inductor.

FIG. 10 is a Smith chart (1001) representation of the impedance seen at the input of the virtual inductor circuit, 601. The Smith chart is often used to map impedance values of radio-electronics circuitry. The upper half of the chart is used to map inductive impedance, the lower half of the chart capacitive impedance. A pure capacitance or inductance is plotted on the outer rim of the Smith chart. A fixed capacitance value is represented by a single point at a given frequency on the rim of the lower half of the chart. A variable capacitance is represented by a continuous arc on the perimeter of the outermost circle of the chart 1002.

Line 1002 is the impedance curve of the impedance of the variable shunt capacitor (802 of FIG. 9). Line 1002 represents providing a variable capacitance. Transmission line impedances are represented by rotations of impedance points in circular arcs about the center 1006 of the chart 1001. The quarter wavelength transmission line is represented by the rotation of the capacitance curve by 90 degrees about the center of the chart. Adding a transmission line provides a rotation of variable capacitance by transferring the capacitance values to a new set of impedance points. The rotation is about the center of the chart and the amount of displacement about the rim of the chart is proportional to the length of the transmission line. Reference line 1004 represents the zero degree reference point of a single point on the capacitive reactance curve. Line 1005 represents the same point rotated 90-degrees by a quarter wavelength transmission line. As can be seen from the chart the arc representing the impedance of the variable capacitor now appears to be an inductance as it falls in the upper half of the Smith Chart.

Figure 11:
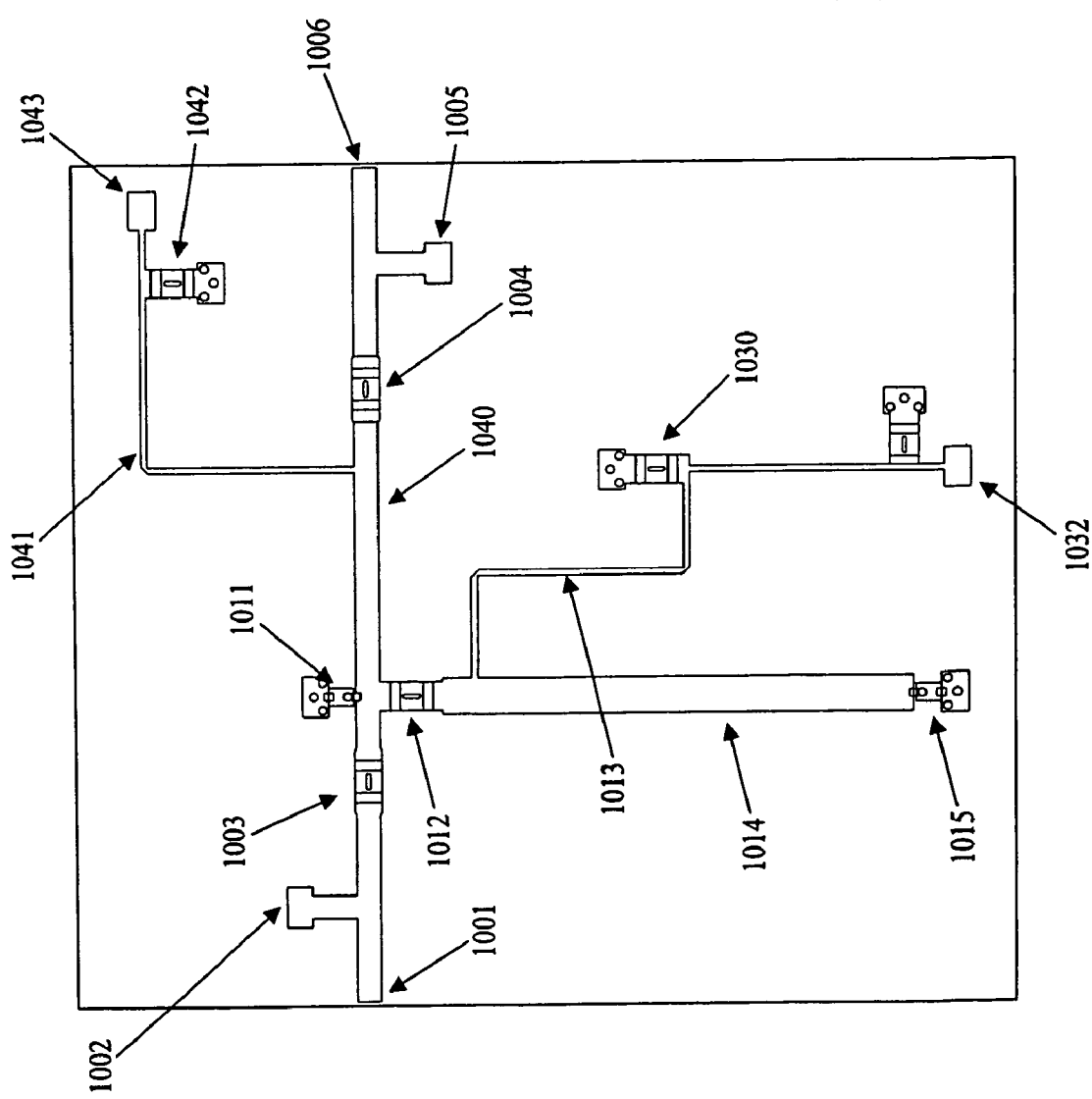
FIG. 11 is a circuit layout of a first embodiment of a group delay adjusting circuit.

FIG. 11 is a circuit layout of a first embodiment of a group delay adjusting circuit. A microstrip through line 1040 includes the first terminal and the second terminal. The first terminal with microstrip through line 1040 is coupled to a first terminal of a DC blocking capacitor 1003. The second terminal of microstrip through line 1040 is coupled to a first terminal of a second DC blocking capacitor 1004. The first DC blocking capacitor 1003 includes a second terminal coupled to a first terminal of a microstrip line input port 1001. Microstrip line input port includes a second terminal forming an input connection, and a third terminal coupled to a stub matching structure 1002. The stub matching structure forms a T-junction with the microstrip line input port 1001.

A second terminal of DC blocking capacitor 1004 is coupled to a first terminal of a microstrip line output port 1006. Microstrip line output port 1006 includes a second terminal forming an output and a third terminal coupled to a stub matching structure 1005. Stub matching structure 1005 is coupled to the microstrip output port as a T-junction.

Microstrip main through line 1040 includes a third terminal along its length, that is coupled to a first terminal of a high impedance microstrip transmission line 1041. A second terminal of high impedance microstrip transmission line 1041 is coupled to a first terminal of an RF bypass capacitor 1042. A second terminal of RF bypass capacitor 1042 is coupled to ground. The first terminal of RF bypass capacitor 1042 is coupled to a second control signal input port, or pad, 1043. A signal is input at pad 1043 to control of the virtual inductor.

A fourth terminal is formed along the length of microstrip main through line 1040. The fourth terminal of microstrip main through transmission line 1040 is coupled to a first terminal of a DC blocking capacitor 1012. A second terminal of DC blocking capacitor 1012 is coupled to a first port of a quarter wave length transmission line 1014. A second terminal quarter wave length transmission line 1014 is coupled to a first terminal of a varactor diode 1015. A second terminal of varactor diode 1015 is coupled to ground. A third terminal along the length of the quarter wave length transmission line 1014 is coupled to a first terminal of a high impedance transmission line 1013. A second terminal of high impedance transmission line 1013 is coupled to a first terminal of RF bypass capacitor 1030. A second terminal of RF bypass capacitor 1030 is coupled to ground. The second terminal of high impedance transmission line 1013 is also coupled via a circuit trace to a control signal input port 1032. Control signal input port 1032 supplies a control signal to the virtual inductor that comprises quarter wave length transmission line 1014 and varactor diode 1015. First control signal input port 1032 may also be supplied with an additional shunt coupled bypass capacitor.

Microstrip main through transmission line 1040 includes a fifth terminal along its length that is coupled to a first terminal of a varactor diode 1011. A second terminal of varactor diode 1011 is coupled to ground. A single section group delay adjustor such as described above typically allows for 0.5 ns of adjustment in the 2.1 GHz band. The circuit above may be cascaded with identical or similar group delay adjustment circuits in order to gain additional bandwidth and group delay adjustment range. Microstrip circuits such as described above typically utilize copper traces or equivalent disposed upon a first side of dielectric substrate such as Teflon-glass or equivalent with a substantially solid ground plane on a second side of the dielectric substrate. In alternative embodiment, the microstrip circuits are part of a multiplayer laminated printed wiring board (PWB) assembly.

Figure 12:
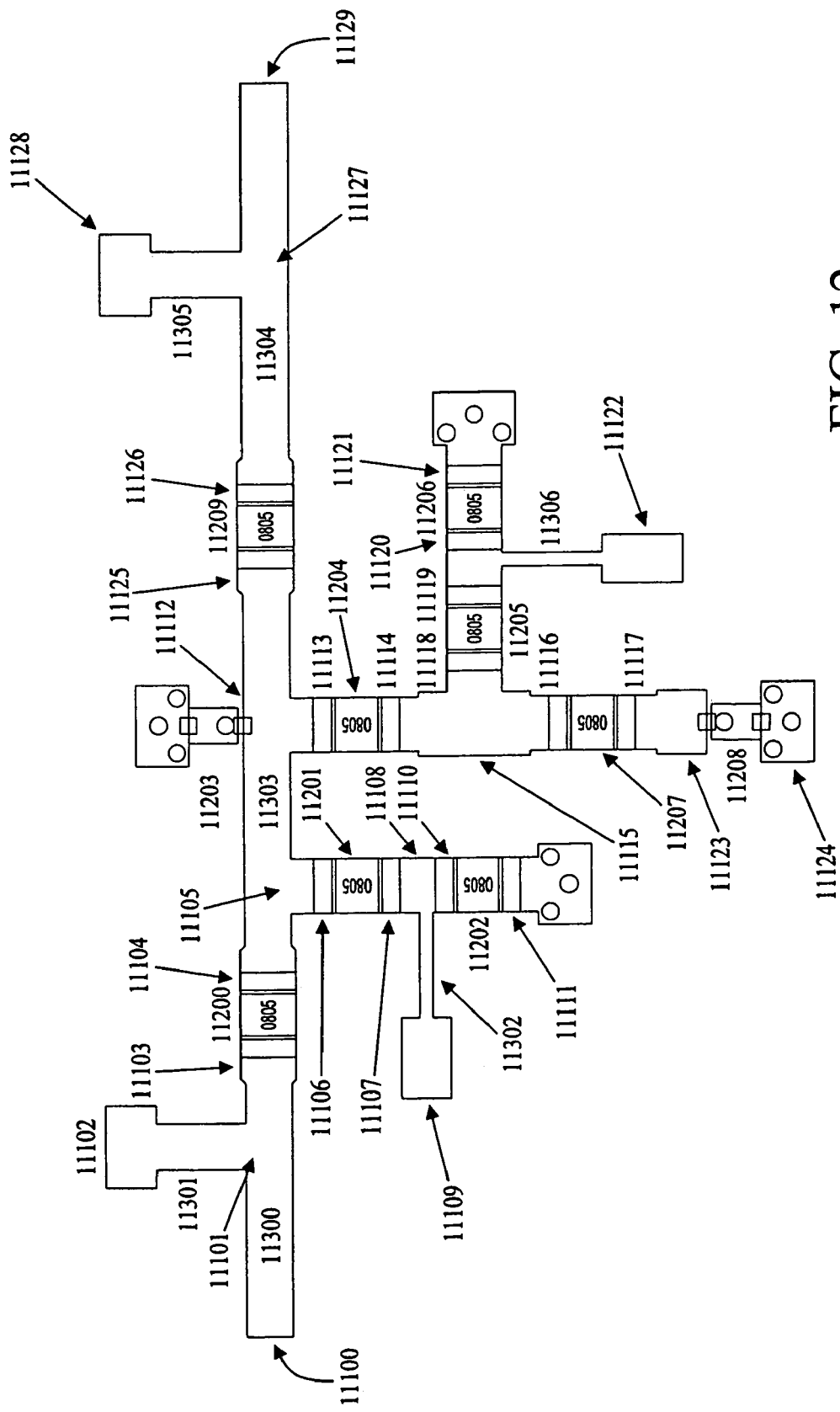
FIG. 12 is a circuit layout of a second embodiment of a group delay adjusting circuit

FIG. 12 is a circuit layout of a second embodiment of a group delay adjusting circuit. In the embodiment shown, discreet components including resistors, high frequency inductors, capacitors, microstrip lines, and varactor diodes are utilized. In the embodiment shown, an input port 11100 and an output port 11129 are matched to the circuitry they are coupled to such that the delay circuit functions in a 50 Ohm characteristic impedance system. However, the characteristic impedances and the matching structure may be adjusted by methods known to those skilled in the art such that the group delay circuit is matched to a system of circuitry having other characteristic impedances. In addition, the circuit described may be equivalently implemented by methods known to those skilled in the art in a balanced configuration.

A through microstrip transmission line 11303 includes the first terminal coupled to a first node 11104 coupled to a first terminal of a DC blocking capacitor 11200. DC blocking capacitor 11200 includes a second terminal coupled to a node 11103 of a microstrip transmission line matching structure 11300. Microstrip transmission line matching structure 11300 includes an input terminal 11100, and a third node coupled to a first terminal of an open stub microstrip 11301. The open stub microstrip 11301 includes a second terminal coupled to an open stub node 11102. Open stub microstrip line 11301 is coupled to microstrip line 11300 at node 101 such that a T-junction is formed.

A second terminal of microstrip through line 11303, forms a node 11125. Node 11125 is coupled to a first terminal of a DC blocking capacitor 11209. A second terminal DC blocking capacitor 11209 is coupled to an input terminal of an impedance matching microstrip circuit 11126. The impedance matching circuit 11126 includes a microstrip transmission line 11304 having the first terminal coupled to node 11126 and the second terminal 11129 that forms an output port. A third node 11127 of transmission line 11304 is coupled to a first terminal of an open stub microstrip transmission line 11305. A second terminal of open stub microstrip transmission line 11305 is coupled to an open stub node 11128.

A third node of microstrip through line 11303 is coupled to a first terminal of a varactor diode 11203, at node 11112. A second terminal of a varactor diode 11203 is coupled to a ground connection.

A fourth terminal of through transmission line 11303 forms node 11105. The node forms a T-junction in the microstrip and is coupled to a first terminal 11106 of resistor 11201. Resistor 11201 includes a second terminal coupled to a first terminal 11107 of a transmission line junction that forms node 11108. A second terminal of the transmission line junction forms node 11110. Node 11110 is coupled to a first terminal of a bypass capacitor 11202. A second terminal of bypass capacitor 11202 is coupled to ground at node 11111. A third terminal of a transmission line junction forms node 11302 which is coupled to an input signal pad 11109.

A fifth terminal of microstrip through transmission line 11303 is located at a node 11113 along its length. Node 11112 is coupled to a first terminal of a DC blocking capacitor 11204. A second terminal of DC blocking capacitor 11204 is coupled to a first terminal of a T-shaped microstrip structure 11115. T-shaped microstrip structure 11115 is constructed utilizing methods known to those skilled in the art.

A second terminal of the T-shaped microstrip structure 11115 forms node 11118. Node 11118 is coupled to a first terminal of a resistor 11205. A second terminal of resistor 11205 is coupled to a node 11119.

Node 11119 is a first terminal of a pad structure that includes a second terminal, or node 11120 and a third terminal coupled to a first terminal of a microstrip line 11306. Microstrip line 11306 includes a second terminal coupled to a signal input pad 11122. Node 11120 is coupled to a first terminal of a bypass capacitor 11206. A second terminal of bypass capacitor 11206 is coupled to ground at node 11121.

A third terminal of T-shaped microstrip structure 11115 is coupled to a node 11116. Node 11116 is coupled to a first terminal of an inductor 11207. Inductor 11207 is a surface mounted thick film inductor, of an appropriate value for the frequencies of interests. Equivalently, other types of inductors may be used in place of a thick film inductor. A second terminal of inductor 11207 is coupled to a node 11117. The node 11117 is a first terminal of pad 11123. A second terminal of pad 11123 is coupled to a first terminal of a varactor diode 11208. A second terminal of varactor diode 11208 is coupled to ground at pad 11124.

Figure 13:
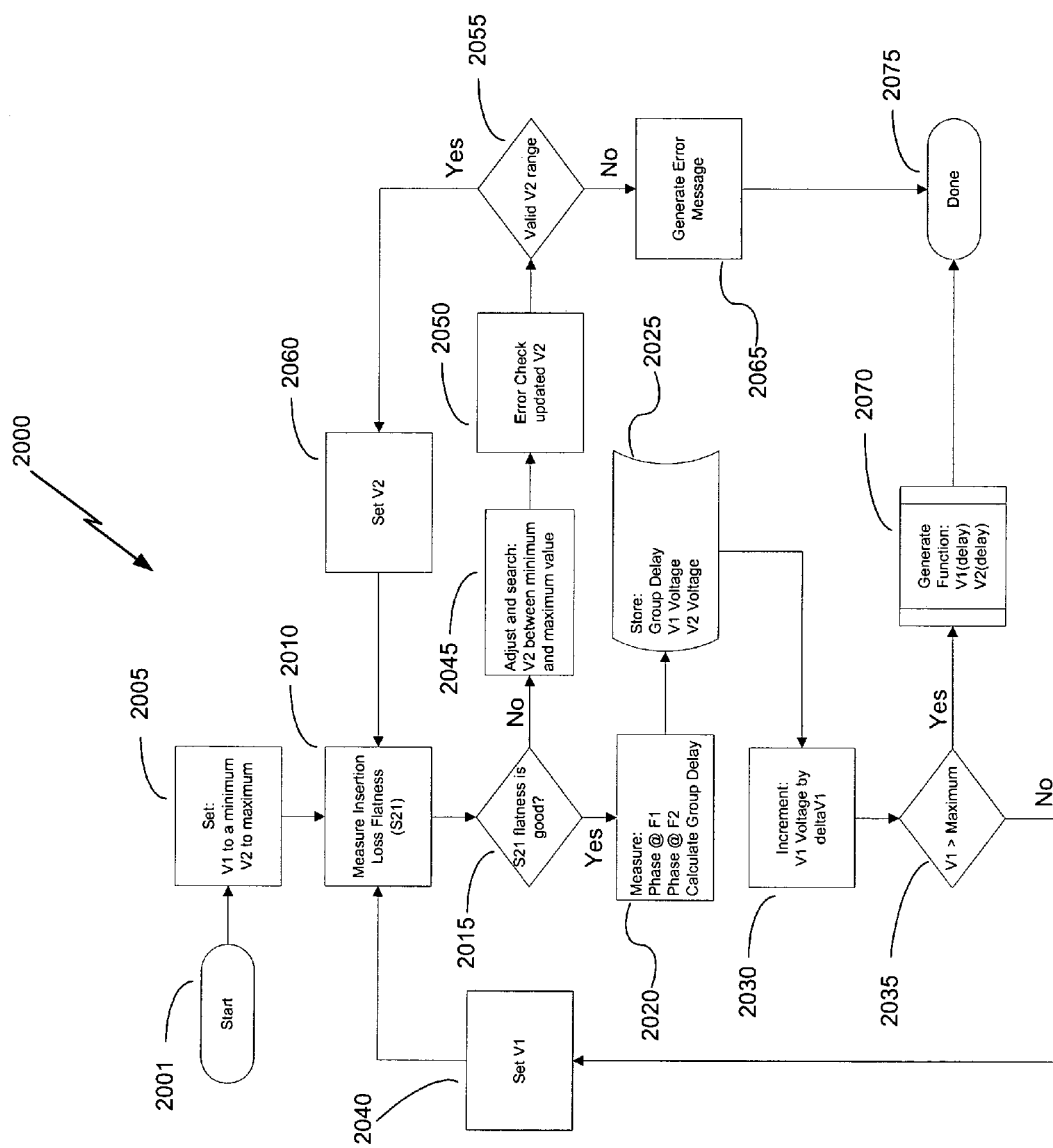
FIG. 13 is a flow diagram illustrating the process of adjusting the group delay by extracting V1 (delay) & V2 (delay) control voltages from the group delay adjuster.

FIG. 13 is a flow diagram illustrating the process 2000 for determining V1(delay) & V2(delay) control voftage functions from the group delay circuit 201. The present invention utilizes two control voltages, referred to as V1 and V2 that are conjunctionally applied (applied at the same time) to respective varactor diodes shown in the previous figures. In addition to the group delay adjuster circuitry it is desirable to provide a process which allows calculation of control voltages V1 and V2. The process is based on maintaining a desired group delay that is provided from an external signal source such as a network analyzer. It is also desirable to use the control voltages to maintain group delay circuit performance.

The method 2000 involves the following sequence of steps, which allow for extraction of the desired control functions. The process is initiated at step 2001. At step 2005 control voltage V1 is set to a minimum, and control voltage V2 is set to a maximum. At step 2010 the flatness of the circuits insertion loss (or utilizing scattering, or "S" parameter terminology $S_{21}$) is measured. At step 2015 the flatness of the circuit insertion loss is evaluated. Those skilled in the art will realize that depending upon the system requirements differing levels of flatness of insertion loss will be acceptable.

If insertion loss flatness is unacceptable the process branches to step 2045. At step 2045 where a search for best S21 flatness is initiated by varying control voltage V2 while maintaining a fixed control voltage V1. The results are saved. At Step 2050 the saved results are examined to find if control voltage V2 is within valid voltage range.

At step 2055 an evaluation is made of the V2 selected. If V2 is not within a predetermined range of valid results an error message is generated at step 2065, and the process is exited at step 2075.

Returning to Step 2055, if V2 is in the valid range of voltages (V2 results are valid) control voltage V2 is set. Next process step 2010 is repeated to verify new V2 results.

At step 2015 once the S21 flatness is good enough the process proceeds to step 2020. At step 2020 phase at lowest in-band frequency is measured, and phase at the highest in-band frequency is measured, and the group delay is calculated.

At step 2025 the group delay, V1, and V2 is stored.

At step 2030 V1 is incremented by a step value determined by method known to those skilled in the art.

At step 2035 evaluation is made to determine if the updated V1 is greater than the maximum allowable V1 control voltage. If the updated V1 is not greater then maximum allowable V1, then voltage V1 is applied to the corresponding varactor diode.

Returning to step 2010 if the updated V1 is greater than the maximum allowable V1, then this is the end of data accumulation. At step 2070 the voltage functions V1(delay) and V2(delay) are calculated based on accumulated data. These functions are saved for later use typically microcontroller memory 2070. The method is complete at step 2075 As understood by one skilled in the art, alternative equivalent embodiments are possible.

Figure 14:
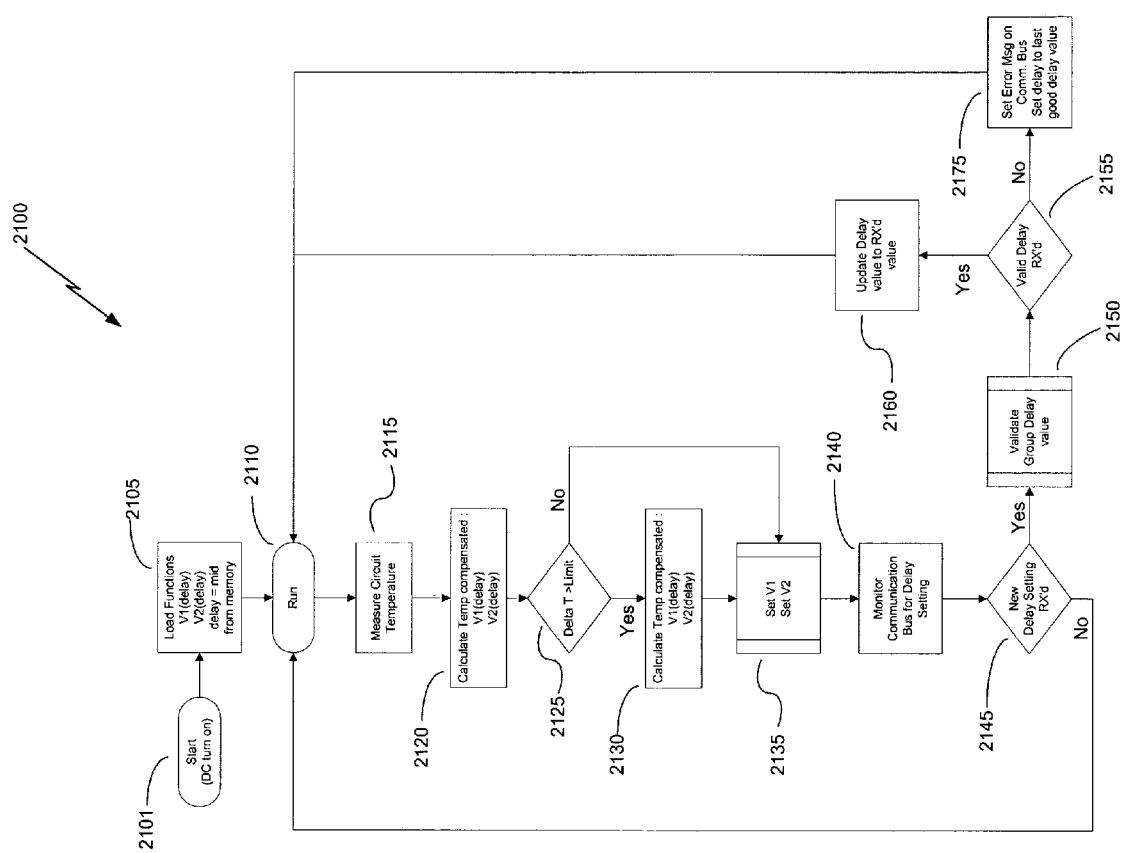
FIG. 14 is a block diagram of a method of setting group delay based on external input command containing a desired delay value.

FIG. 14 is a block diagram of a method of setting group delay based on external input command containing a desired delay value. At step 2101 the process 2100 is initiated with a DC turn on. At step 2105 control functions including V1 (delay), V2 (delay) and delay are loaded from memory. The control signals V1 (delay), and V2 (delay) are functions of the delay ("delay") selected which is chosen utilizing methods known to those skilled in the art to provide a starting point for adjusting the group delay with the group delay adjusting circuit.

At step 2110 the process is initiated, and at step 2115 the circuit temperature is measured. Those skilled in the art will appreciate that temperature drift is a concern in active circuit design and that providing compensation for temperature drift is an important consideration. At step 2120 the previously set values of V1 (delay), and V2 (delay) are adjusted to compensate for the measured temperature utilizing methods known to those skilled in the art. At step 2125 a comparison of the measured temperature is made to the recorded temperature that the initial values of delay V1 (delay), and V2 (delay) were made at. If the temperatures are different the updated, or temperature compensated values of V1 (delay), and V2 (delay)are calculated at step 2130 and passed to step 2135. If the temperatures are the same, compensation is not performed and the process branches to step 2135. At step 2135 the values for V1 and V2 are set in a digital to analog (D/A) controller. Next, at step 2140 the communications bus is monitored. If no new delay setting is on the bus then the process control is passed back to step 2110. If a new delay setting "delay" has been received at step 2145, then the process proceeds to step 2150.

At step 2150 the new group delay setting is received and checked to see if it is within a valid range. The range of valid group delays is selected utilizing methods known to those skilled in the art. At step 2155 a decision is made to determine if the new group delay setting is within the valid range of allowable group delay settings. If the new group delay is outside of the valid range (invalid) then at step 2175 an error message is sent out on the communications bus, and the delay is set to the last good delay value that was used. The process control then passes back to step 2110.

Returning to step 2160, if the new delay is valid then step 2160 is executed. In step 2160 the delay value is updated to the new received value and the process is routed back to step 2110.

Figure 15:
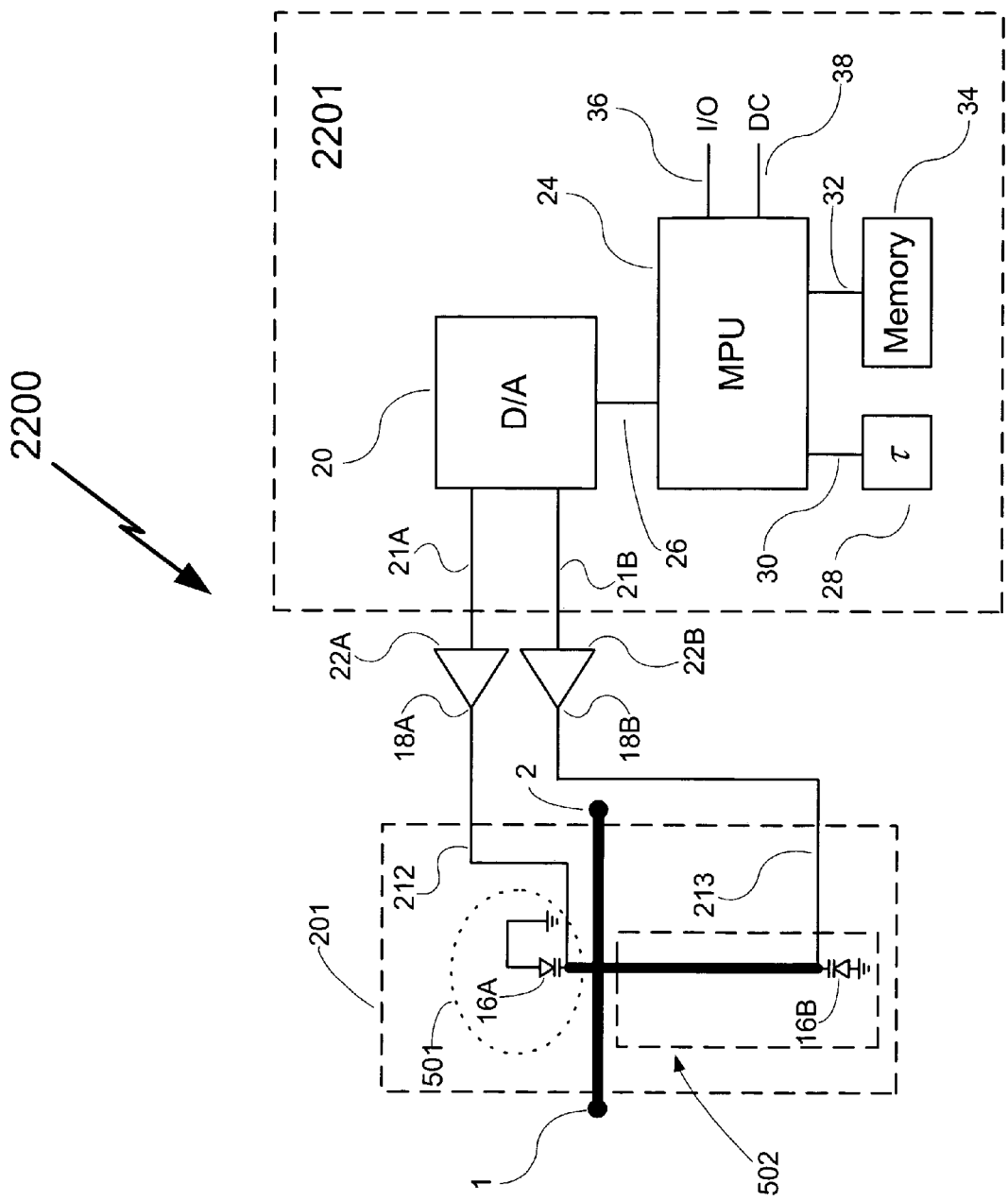
FIG. 15 is a block diagram of an embodiment of a group delay adjusting system with a digital Input/Output (I/O).

FIG. 15 is a block diagram of an embodiment of a group delay adjusting system 2200 including a group delay adjusting circuit 201 (having a virtual inductor 502) and a digital input/output (I/O) circuit 2201. The group delay adjusting circuit 201 includes an RF input port 1 and an RF output port 2. The digital control section includes a conventionally constructed digital to analog converter (D/A) 20, a conventionally constructed processor (MPU) 24, a conventionally constructed memory 34, and a conventionally constructed temperature sensor ($\tau$) 28. As will be appreciated by those skilled in the art, equivalent embodiments of a digital control circuit 2201 may be provided. For example an analog control circuit may be constructed using methods known to those skilled in the art, or the digital control circuit may be implemented using a DSP (digital signal processing) circuit.

Modern microcontrollers (MPU) 24 tend to make analog implementations of a digital control circuit undesirable. Modern MPUs tend to provide the advantages of additional functionality, including active temperature compensation and the ability to update functionality, via changes in programming, that is typically difficult or expensive to provide with analog solutions. As shown, MPU 24 can be a standalone microprocessor supplied from numerous commercial vendors or it can be a part of a larger system. As it is well known to one skilled in the art the choices involving such selection are purely driven by system design considerations, and are not indicative of any special design requirements. As it was noted before NVRAM memory 34 and temperature sensor 28 supply data (32 and 30) to the MPU 24. The MPU 24 implements group delay setting methods (For example 2100, of FIG. 14) and provides digital V1 and V2 inputs 26 to a dual D/A converter 20 where they are converted to analog signals.

Analog outputs 21A and 21B of the dual A/D converter 20 are level shifted and buffered by first driver 22A and second driver 22B respectively. Drivers 22A and 22B are conventionally constructed by methods known to those skilled in the art. The analog driver outputs 18A and 18B are applied to respective first 16A and second 168 varactors in the group delay adjusting circuit and were described previously as control lines 212 and 213. Typical circuit implementations may specify that the length of analog lines (212 and 213) be of certain length and to be filtered accordingly.

Referring to FIG. 14 and FIG. 15 a method for providing digital group delay control 2100, is applied to a group delay adjusting circuit. When group delay adjusting circuit is supplied with power 38 (of FIG. 15) the microprocessor 24 (of FIG. 15) recalls delay functions (V1 and V2) from non-volatile random access memory (NVRAM) 34 (of FIG. 15). Upon successful start up the microprocessor 24 (of FIG. 15) calculates V1 and V2 values for a medium value of delay 2105 (of FIG. 14). The start up delay value can be selected anywhere between minimum and maximum group delay values selected as previously described The group delay circuit is now placed into active operation, as described in update loop 2110 (of FIG. 14).

The update loop performs the following sequence:

First measure the circuit temperature 2115 (of FIG. 14) by reading temperature sensor 28 (of FIG. 15). Next calculate V1(delay) and V2(delay) and apply temperature compensation 2120 (of FIG. 14). Inquire if the temperature is different from last temperature used for compensation at 2115 (of FIG. 14).

If the temperature is different, there was a temperature drift. Perform a temperature compensation on the calculated values of V1(delay) and V2(delay). If the temperature is not different, there was no temperature drift, do not perform a temperature compensation on the calculated values of V1(delay) and V2(delay). Use current calculated values of V1(delay) and V2(delay).

Next set V1 and V2 2135 (of FIG. 14) to the D/A controller 20 (of FIG. 15). Check the I/O bus 36 (of FIG. 15) for a new group delay setting 2140 (of FIG. 14). Inquire if the new group delay setting has been received 2145 (of FIG. 14).

If a new group delay setting has been received it is checked for a valid range 2150 (of FIG. 14). Also inquire if the new group delay setting is within a valid range 2155 (of FIG. 14) of allowable group delay settings.

If the new group delay setting is within a valid range, the delay setting is updated 2160 (of FIG. 14). The process returns to beginning of the update loop 2110 (of FIG. 14).

If the new group delay setting is not within a valid range, delay setting is not updated 2175 (of FIG. 14). The current value of delay is preserved, and an error message is issued by the MPU 24 (of FIG. 15) and sent out via the external I/O bus 36 (of FIG. 15). The process then returns to beginning of the update loop 2110 (of FIG. 14).

If the new group delay setting has not been received, the old group delay setting is used, and the process returns to the beginning of the update loop 2110 (of FIG. 14)

In the embodiments shown values for the capacitors, resistors, inductors, quarter wavelength transmission lines and microstrip lines are chosen utilizing methods known to those skilled in the art to yield an appropriate electrical response for a frequency, or band of frequencies, over which the group delay adjusting circuit operates. For example the values chosen for resistors 11201 (of FIG. 12) and 11205 (of FIG. 12) achieve a dual purpose. Resistors 11201 (of FIG. 12) and 11205 (of FIG. 12) provide a high RF impedance DC connection that blocks RF signals, and provides a current limiting function to set an appropriate bias in a corresponding varactor diode. As in the first embodiment, this single ended circuit may be equivalently constructed as a balanced circuit, and cascaded with identical or similar group delay circuits to achieve an overall desired response.

The invention claimed is:

1. A method of adjusting a group delay adjusting circuit comprising:
   applying a capacitive control signal to adjust a first variable capacitance;
   adjusting the first variable capacitance by applying the capacitive control signal to the first variable capacitance such that the capacitance of the group delay adjusting circuit is adjusted;
   applying an inductive control signal to a second variable capacitance; and
   adjusting the second variable capacitance by applying the inductive control signal to the second variable capacitance of a virtual inductor such that the inductance of the group delay adjusting circuit is adjusted.

2. The method of claim 1, further comprising the step of applying a signal to the group delay adjusting circuit prior to the step of applying a capacitive control signal.

3. The method of claim 2, further comprising the step of measuring a group delay of the signal prior to the step of adjusting the first variable capacitance.

4. A method of adjusting a group delay adjusting circuit comprising:
   applying a capacitate control signal to adjust a first variable capacitance;
   adjusting the first variable capacitance by applying conjunctional positive capacitive control signal to the first variable capacitance;
   applying an inductive control signal to a second variable capacitance; and
   adjusting the second variable capacitance by applying a conjunctional positive inductive control signal to the second variable capacitance.

5. The method of claim 4, further comprising the step of applying a signal to the group delay adjusting circuit prior to the step of applying a capacitive control signal.

6. The method of claim 5, further comprising the step of measuring a group delay of the signal prior to the step of adjusting the first variable capacitance.

7. A group delay adjusting circuit, comprising:
   a transmission line having an input and an output; and
   a stub matching structure including a virtual inductor having a first terminal coupled to the transmission line and a second terminal coupled to ground, and including a first delay adjust signal input, a second delay adjust signal input and a DC bias input;
   whereby a group delay of a signal envelope coupled to the input of the transmission line is adjusted at the output of the transmission line, by coupling a first variable voltage to the first delay adjust signal input, coupling a second variable voltage to the second delay adjust signal input, and coupling a DC bias voltage to the DC bias input.

8. The group delay adjusting circuit of claim 7, wherein the transmission line is a microstrip transmission line.

9. The group delay adjusting circuit of claim 7, wherein the transmission line is a stripline transmission line.

10. The group delay adjusting circuit of claim 7, wherein the transmission line length is arbitrary.

11. The group delay adjusting circuit of claim 10, wherein the virtual inductor includes a quarter wave transmission line having a first terminal coupled to the transmission line and a second terminal coupled to a first terminal of a variable capacitor, and having a second terminal of the variable capacitor coupled to ground.

12. The group delay adjusting circuit of claim 7, wherein the first delay adjust signal input and the second delay adjust signal are responsive to varying voltages.

13. A group delay adjusting circuit comprising:
   an electronically adjustable variable capacitance having its capacitance adjusted by a first delay adjust signal;
   an electronically variable virtual inductor having its inductance adjusted by a second delay adjust signal, coupled in parallel to the electronically variable capacitance at a node; and
   a transmission line coupled to the electronically variable virtual inductor and the electronically adjustable variable capacitor at the node,
   whereby a signal envelope having a group delay applied to the node is adjusted by the capacitance and inductance such that the group delay is adjusted.

14. The group delay adjusting circuit of claim 13, wherein the electronically variable capacitance comprises a first terminal coupled to a first terminal of the electronically variable virtual inductor, and a second terminal coupled to ground.

15. The group delay adjusting circuit of claim 13, wherein the electronically variable virtual inductor comprises a first terminal coupled to a first terminal of the electronically variable capacitor, and a second terminal coupled to ground.

16. The group delay adjusting circuit of claim 13, further comprising a capacitive control input coupled to a first delay adjust voltage signal.

17. The group delay adjusting circuit of claim 13, further comprising an inductive control input coupled to a second delay adjust voltage signal.

18. A group delay adjusting circuit comprising:
   a means for providing an electronically adjustable variable capacitance; and
   a means for providing an electronically variable inductance coupled in parallel to the means for providing an electronically adjustable capacitance;
   whereby the parallel combination includes a first signal node coupled to a signal, and a second ground node coupled to a ground potential;
   whereby a signal envelope having a group delay applied to the node is adjusted by the electronically adjustable variable capacitance and the electronically adjustable variable inductance such that the group delay is adjusted.

19. A method of providing group delay adjustment comprising:
   adjusting a first parallel variable shunt capacitance having a first terminal and a second terminal coupled to a ground;
   adjusting a second variable shunt capacitance; and
   electrically rotating the second variable shunt capacitance to a variable inductance by coupling the variable shunt capacitance to a first terminal of a series transmission line having an electrical length of a quarter wavelength at a frequency of operation, in which a second terminal of the series transmission line is coupled to the first terminal of the first parallel variable shunt capacitance such that the second terminal of the series transmission line provides a variable inductance;
   whereby the second variable shunt capacitance is transformed into a variable inductance by the series transmission line and group delay is adjusted.

20. A method of providing group delay adjustment comprising:
   setting a first control voltage to a first value;
   adjusting a second control voltage to produce a predetermined insertion loss flatness;
   measure a phase at a low frequency;
   measure the phase at a high frequency;
   calculate the group delay; and
   record the first control voltage, the second control voltage values and group delay.

21. The method of providing group delay adjustment of claim 20, further comprising:
   incrementing the first control voltage from the first value in a plurality of differential steps until a final control voltage is achieved;
   each step of the plurality of differential steps includes the steps of adjusting the second control voltage value until a best insertion loss flatness is achieved while the first control voltage is fixed;
   measure a phase at a lowest frequency;
   measure the phase at a highest frequency;
   calculate a group delay; and
   record the first control voltage value, the second control voltage value and the group delay.

22. A method of providing group delay adjustment of claim 21 further comprising:
   calculating an inverse first control voltage and an inverse second control voltage functions based on a first and a second control voltage and group delay accumulated data, to provide a first and a second control voltage for a given desired group delay within range of group delay adjustment range;
   storing the group delay to produce the first and the second control voltage functions in a digital to analog converter; and
   providing digital to analog conversion wherein group delay to first and second control voltage functions provides on demand command conversion from a digital word to a first and a second control voltage setting to provide a desired group delay setting.

23. A method of providing group delay adjustment of claim 22 further comprising providing digital to analog conversion wherein group delay to first and second control voltage functions includes temperature compensation to maintain a desired group delay setting over a full operating temperature range.

* * * * *